United States Patent [19]

Suzuki et al.

[11] Patent Number: 5,754,714
[45] Date of Patent: May 19, 1998

[54] SEMICONDUCTOR OPTICAL WAVEGUIDE DEVICE, OPTICAL CONTROL TYPE OPTICAL SWITCH, AND WAVELENGTH CONVERSION DEVICE

[75] Inventors: Nobuo Suzuki, Tokyo; Yuzo Hirayama, Yokohama, both of Japan

[73] Assignee: Kabushiki Kaisha Toshiba, Kawasaki, Japan

[21] Appl. No.: 526,384

[22] Filed: Sep. 11, 1995

[30] Foreign Application Priority Data

| Sep. 17, 1994 | [JP] | Japan | 6-248451 |
| Mar. 1, 1995 | [JP] | Japan | 7-042014 |
| Apr. 26, 1995 | [JP] | Japan | 7-102198 |

[51] Int. Cl.$^6$ .................................................. G02F 1/295
[52] U.S. Cl. ........................... 385/5; 385/16; 385/131
[58] Field of Search ........................... 385/5, 4, 8, 9, 385/14, 15, 16, 3, 131; 372/102

[56] References Cited

U.S. PATENT DOCUMENTS

| 4,755,015 | 7/1988 | Uno et al. | 385/131 |
| 5,155,737 | 10/1992 | Ikeda et al. | 372/102 X |
| 5,191,630 | 3/1993 | Tajima | 385/5 X |
| 5,315,422 | 5/1994 | Utaka et al. | 385/3 X |

OTHER PUBLICATIONS

Fifth Optoelectronics Conference (Dec. '94) Technical Digest, Paper 13E2-2; "Light–Controlled Optical Modulation Using Three Energy Levels in Undoped Quantum Well Structure", Susumu Noda, et al. pp. 92–93, Jul. 1994.

Electron Intersubband Transistions to 0.8 eV (1.55 μm) in InGaAs/AlAs Single Quantum Wells, by J. H. Smet, L. H. Peng, Y. Hirayama, and C. G. Fonstad; Appl. Phys. Lett. vol. 64, No. 8, Feb. 21, 1994.

Feasibility of 1.55 μm Intersubband Photonic Devices Using InGaAs/AlAs Pseudomorphic Quantum Well Structures, Yuzo Hirayama, Jurgen H. Smet, Lung–Han Peng, Clifton G. Fonstad and Erich P. Ippen, Jpn. J. Appl., Phys., vol. 33 (1994), pp. 890–895 Jan. 1994.

*Primary Examiner*—Phan T. H. Palmer
*Attorney, Agent, or Firm*—Oblon, Spivak, McClelland, Maier & Neustadt, P.C.

[57] ABSTRACT

A semiconductor optical waveguide device comprises a stripe-shaped semiconductor optical waveguide, part of the semiconductor optical waveguide being an active layer producing gain by electric current injection, and part of the semiconductor optical waveguide being an intra-band resonant absorption layer in which an intra-band absorption resonant wavelength is arranged within the gain band of the active layer, and means for injecting electric current into the active layer.

15 Claims, 17 Drawing Sheets

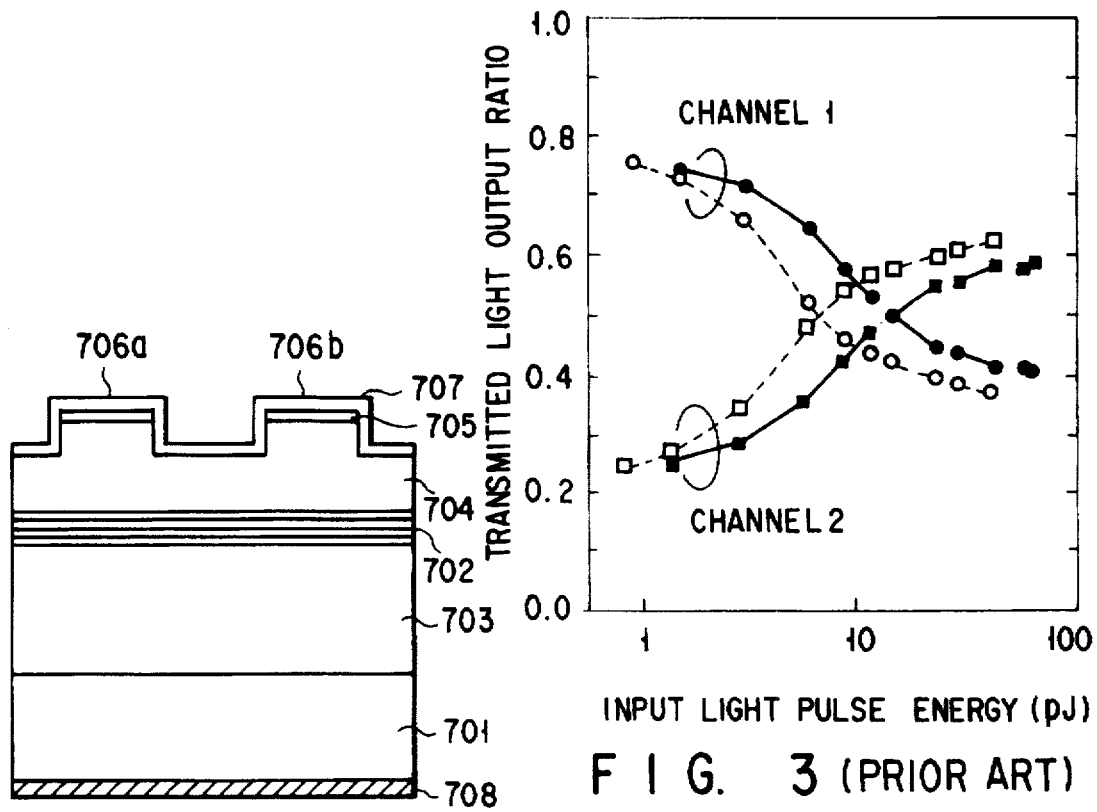
F I G. 2 (PRIOR ART)
F I G. 3 (PRIOR ART)
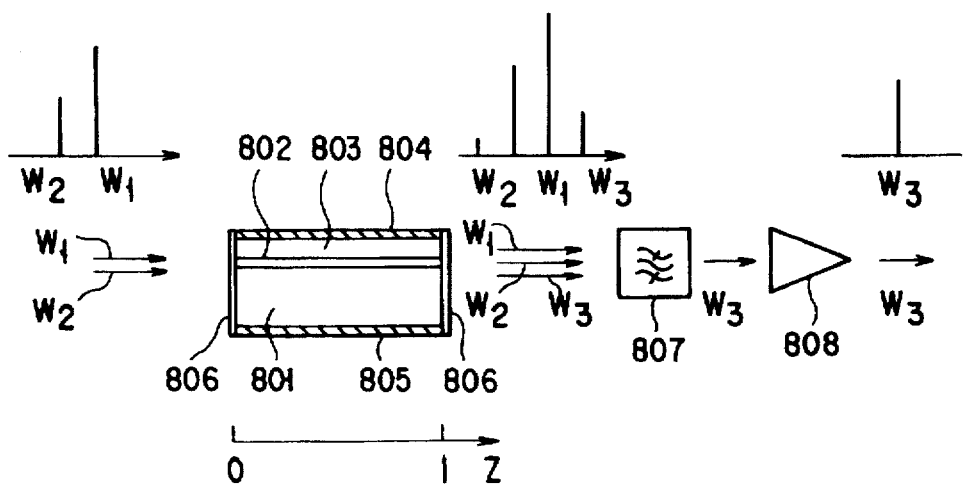
F I G. 4 (PRIOR ART)

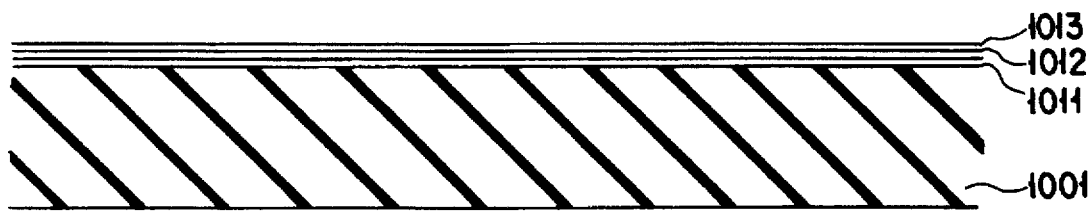
F I G. 17A
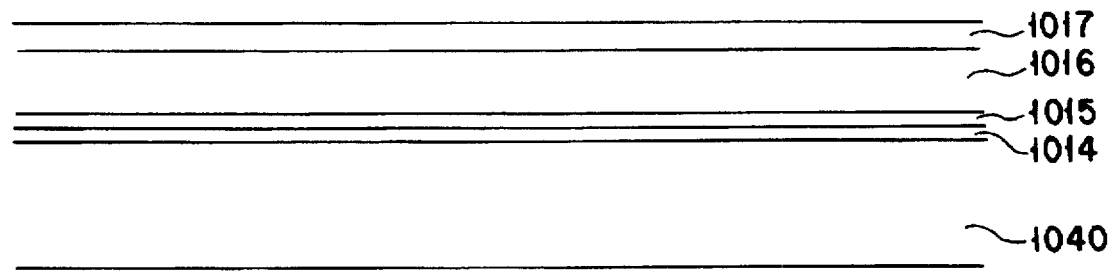
F I G. 17B
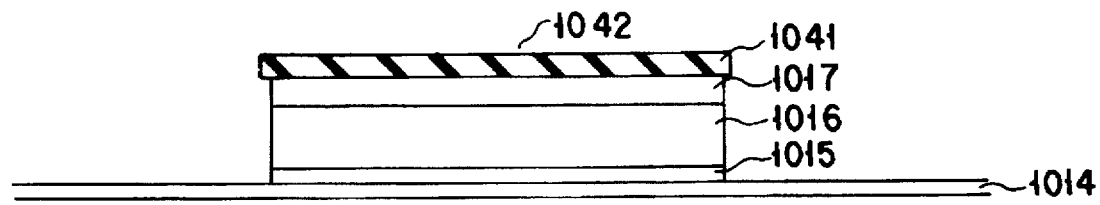
F I G. 17C
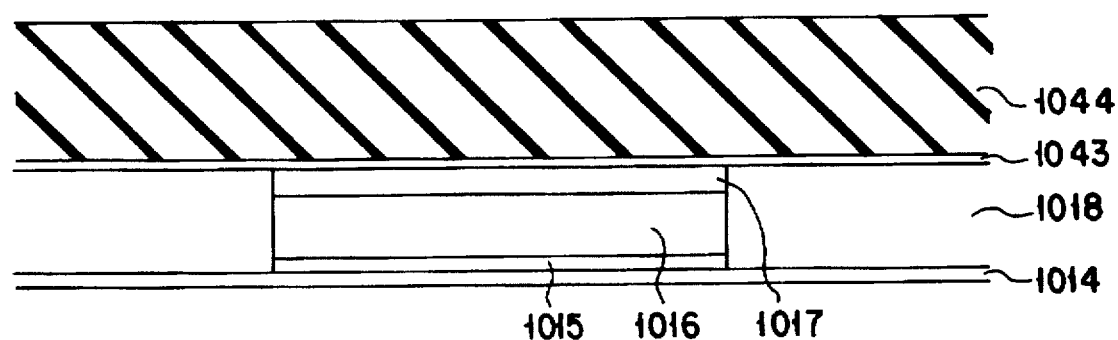
F I G. 17D

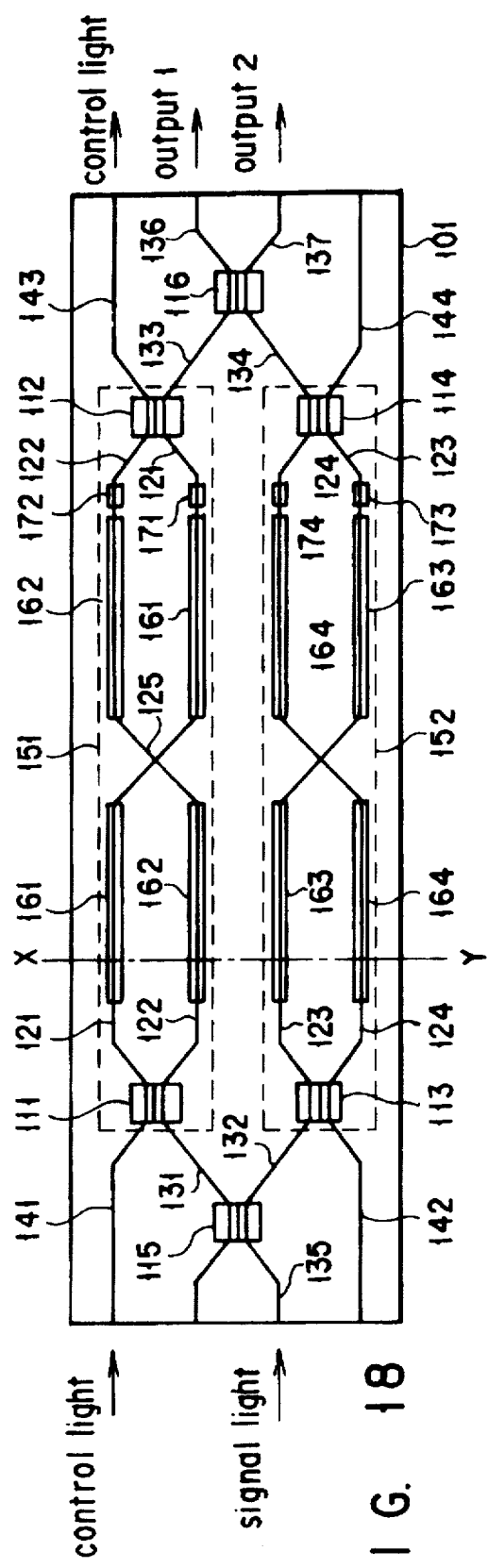
F I G. 18
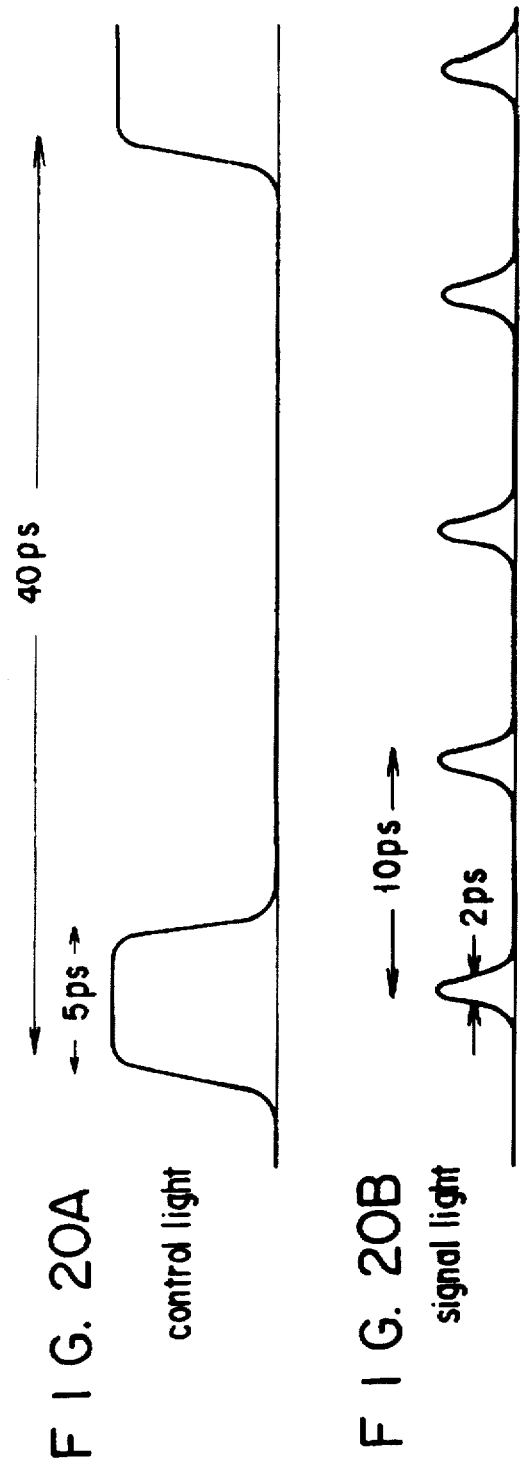
F I G. 20A
F I G. 20B

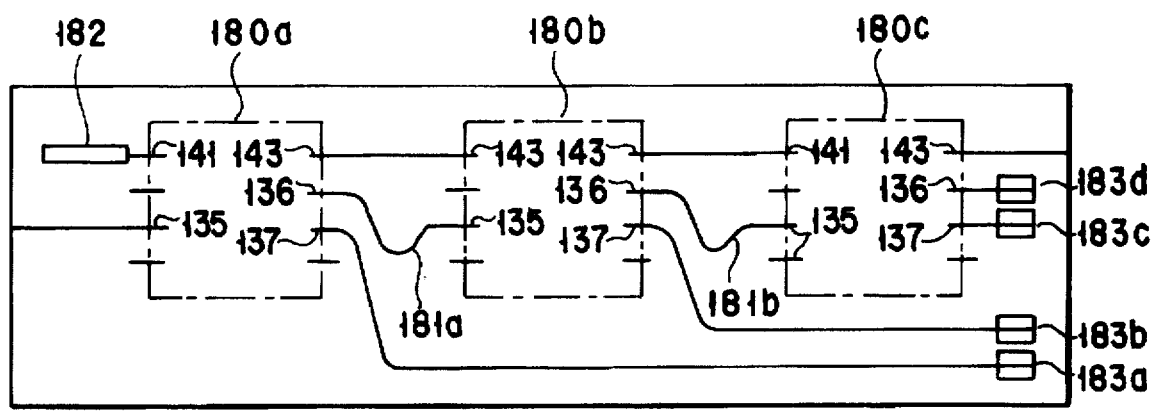
F I G. 21
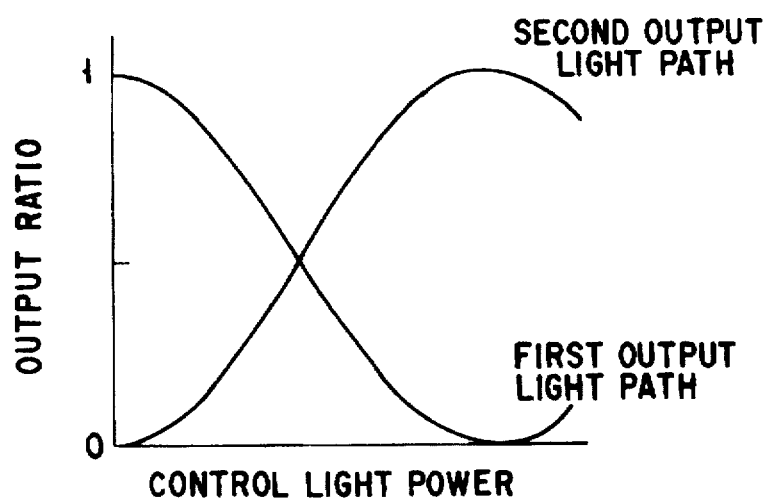
F I G. 22

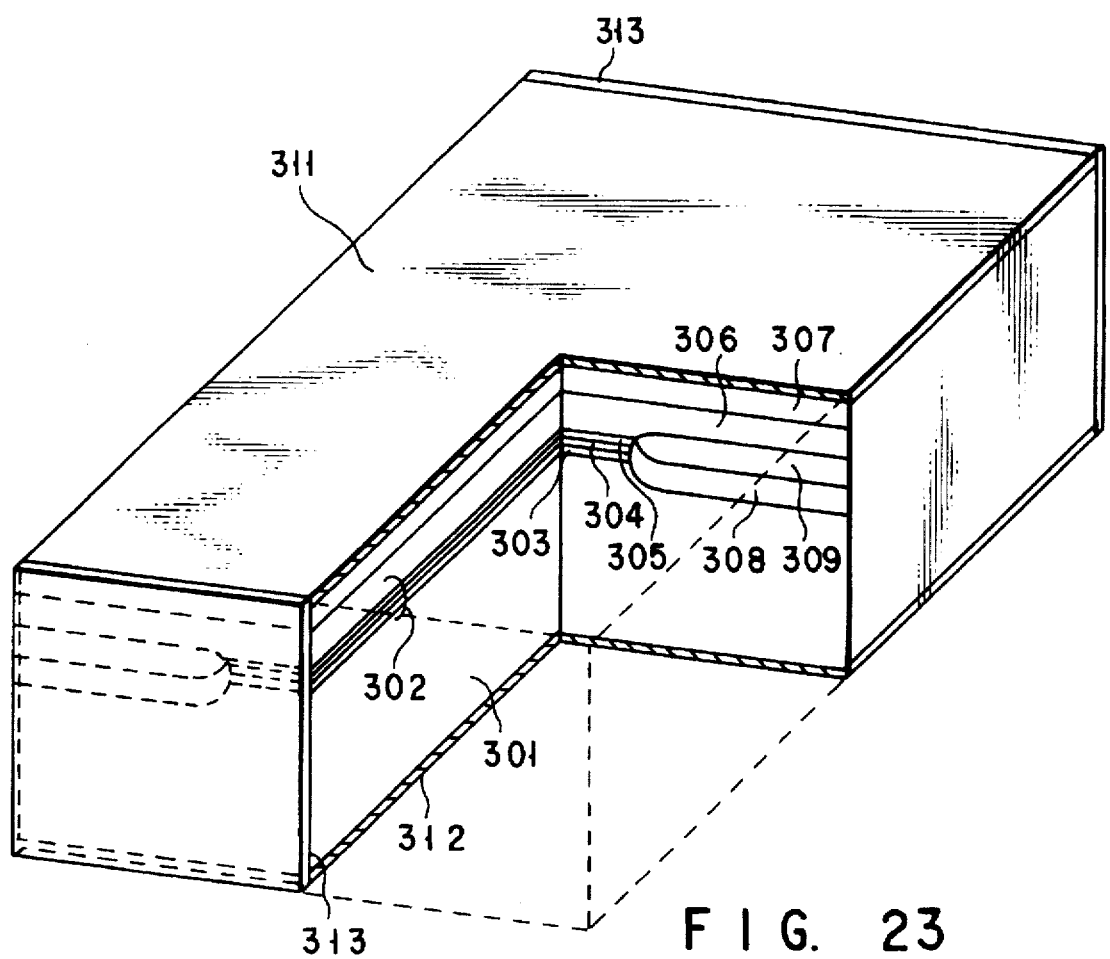
F I G. 23
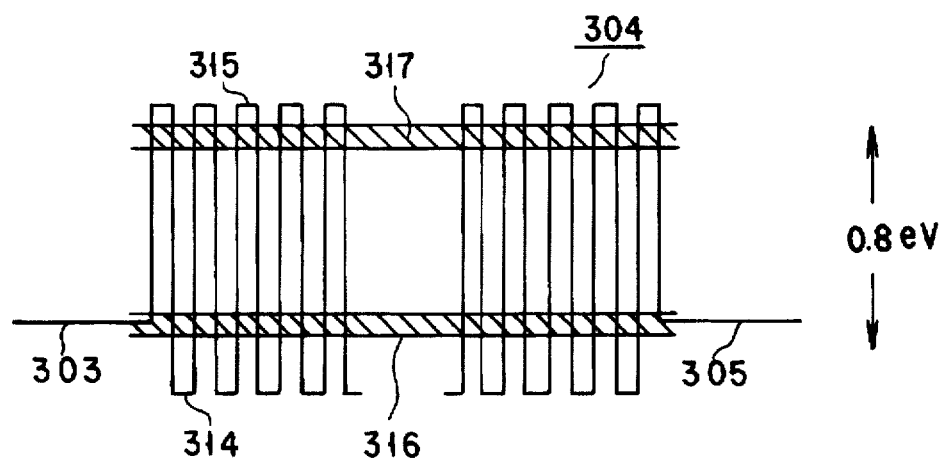
F I G. 24

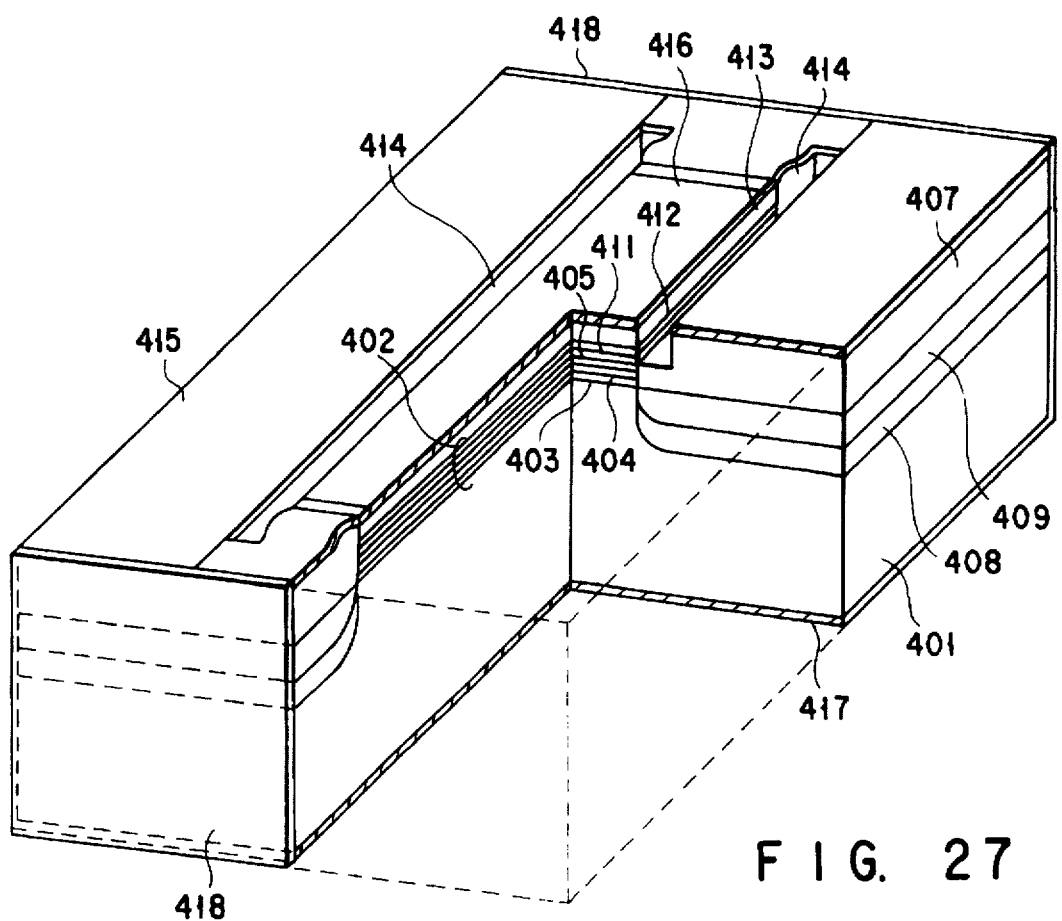
F I G. 27
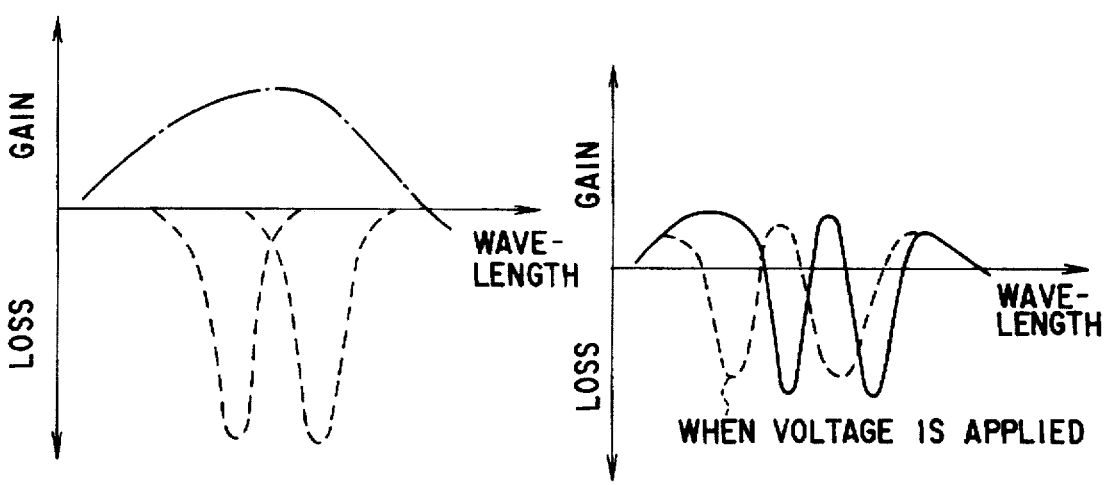
F I G. 28A
F I G. 28B
WHEN VOLTAGE IS APPLIED

| | INTERBAND | INTERSUBBAND |
|---|---|---|
| DISPLACEMENT OF CHARGE x | LATTICE CONSTANT ~0.6 nm | WELL WIDTH ~1.8 nm |
| DIPOLE MOMENT $\mu=ex$ (RELATIVE VALUE) | 1 | 3 TIMES |
| THIRD-ORDER NONLINER SUSCEPTIBILITY $\chi(3) \propto \mu^4$ (RELATIVE VALUE) | 1 | ~100 TIMES |
| ABSORPTION COEFFICIENT $\alpha \propto \mu^2$ (RELATIVE VALUE) | 1 | ~10 TIMES |
| TIME CONSTANT $\tau$ | 1 ns | $\lesssim$ 1 ps |
| FIGURE OF MERIT $\frac{|\chi(3)|}{\alpha\tau}$ (RELATIVE VALUE) | 1 | $> 10^4$ |

F I G. 33

SEMICONDUCTOR OPTICAL WAVEGUIDE DEVICE, OPTICAL CONTROL TYPE OPTICAL SWITCH, AND WAVELENGTH CONVERSION DEVICE

BACKGROUND OF THE INVENTION

1. Field of the Invention

This invention relates to an optical waveguide device and, more particularly, it relates to an optical waveguide device, an optical control type optical switch, and a wavelength conversion device capable of being externally controlled for intra-band transition within its optical waveguide layer in order to operate for a specifically assigned function.

2. Description of the Related Art

The technological development of optoelectronics in recent years particularly in terms of semiconductor laser, low loss optical fiber, optical fiber amplifiers and high speed integrated circuits has made it possible to transmit data at an enhanced rate of 10 gigabits per seconds over a very long distance. In the so-called multimedia age which we expect to see in the near future, the end users of a data transmission network are believed to be able to utilize a vast amount of data including highly defined visual images on a real time basis and, for such a system to be realized, construction of huge infrastructures that can support the operation of high speed data transmission and processing is indispensable.

However, despite the technological development of high speed integrated circuits, electronic apparatuses designed to process data at a rate greater than tens of several gigabits per second are still very costly because of a number of problems including the delay of data transmission over wires, a high energy consumption rate and a high manufacturing/assembling cost. In an attempt to bypass these problems, a new technology of optical routing that can be used to process a vast amount of data that cannot be electronically dealt with is attracting attention.

To put an optical routing system in place, semiconductor optical waveguide devices (optical control type ultrahigh speed optical routing switches (routers)) have to be developed so that switching operations may be carried out in only several picoseconds and such operations may be repeated for a number of times without problem.

Most advanced optical control type ultrahigh speed optical switches known to date may be optical switches utilizing the nonlinearity of optical fiber and typical examples of such switches include nonlinear optical loop mirrors and Kerr shutters. However, a nonlinear optical switch realized by using optical fiber is normally large and very sensitive to acoustic vibrations and hence lacks reliable stability, not to mention a high manufacturing costs Additionally, when such a switch is used as an optical logic device, it shows a problem of too long delay time for each stage of operation.

From a practical point of view, nonlinear optical switches comprising a semiconductor optical waveguide are promising. However, a semiconductor nonlinear optical switch is accompanied by a problem of being poorly nonlinear, requiring too much energy for switching operations in a non-resonant wavelength range. Although it is highly nonlinear in a resonant wavelength range, it cannot be operated repetitively because of a long lifetime of carriers of electric charges and shows an enhanced degree of absorption in that wavelength range. Therefore, no optical control type optical switches are known to data that operate at high speed and with improved efficiency.

The nonlinearity of active and transparent optical waveguides are drawing attention as it may provide a solution to the above identified problem. (See, inter alia, C. T. Hultgren, et al., Appl. Phys. Lett., vol.59, pp.635–637, 1991, C. T. Hultgren, et al. Appl. Phys. Lett., vol.61, pp.2767–2768, 1992.) In this regard, there is proposed the use of a traveling wave type semiconductor laser amplifier under a condition that the level of the bias current and the optical wavelength are selected so as to balance the gain and the loss.

FIGS. 1A through 1C of the accompanying drawings are cited from the above documents to illustrate the change with time of the phase of a pulse of transmitted probe light after passing through an excited optical pulse (with a pulse width of 440 fs). Note that the change with time of the phase of probe light is proportional to the change in the internal refractive index. In FIG. 1A, the semiconductor laser amplifier is biased to the gain side and the gain is apt to become saturated as strong exciting light is applied because carriers are consumed at an enhanced rate to amplify the incident light. If, on the other hand, the semiconductor laser amplifier is biased to the loss side as shown in FIG. 1C, the loss is apt to become saturated by carriers excited by a strongly excited optical pulse. In either case, the device is restored from a saturated condition with a period of time that corresponds to the carrier lifetime. Thus, a number of factors that require several nanoseconds for recovering from saturation can simultaneously affect the change in the refractive index to make the device unable to operate stably and repetitively at high speed.

With a transparent condition of FIG. 1B, to the contrary, neither gain saturation nor loss saturation takes place and hence no slow factors appear on the change in the refractive index so that only quick changes in the refractive index can be utilized. Additionally, since any loss is compensated by the stimulated emission gain given rise to by current injection, the insertion loss can be suppressed to a low level to make multi-stage connection highly feasible.

A quick change in the refractive index can be divided in to a negative change component that shows a large initial value and a positive change component that takes place immediately after the negative change. The initial negative change in the refractive index is assumedly caused by excitation of carriers that takes place as a result of two-photon absorption (TPA) and/or free carrier absorption. A carrier excited to a high energy state loses its energy within 1 picosecond through the collision with phonons and another carriers to relax to a low energy state. It is believed that a positive change occurs in the refractive index as the average temperature of carriers of electric charges rises (carrier heating) during the energy transition. A heated carrier further loses its energy as it collides with phonons to return to its original state within several picoseconds. Thus, if only such rapid changes in the refractive index can be utilized, a high speed repetitive operation may be realized at a rate of several hundred gigabits per second.

Two-photon absorption is believed to be mainly attributable to nonlinearity in a non-resonant wavelength range. While no significant nonlinearity is usually achievable in a non-resonant wavelength range, nonlinearity can be realized to a satisfactory level in this instance because of the fact that incident light is in a resonant wavelength range. In a tentative calculation using some of the values shown in an available research document (K. L. Hall et al., Appl. Phys. Lett., vol.62, pp.1320–1322, 1933), a peak power approximately expressed by formula 5.2W/L will give rise to a shift of $\pi$ to probe light for an exciting pulse having a pulse width greater than 1 picosecond, where L is the device length expressed in terms of millimeters. In other words, a switching operation can be realized at a peak power of about 500 mW by using a device having a length of 10 mm. Although such a peak power is actually attainable with a currently available semiconductor pulse laser, the peak power level will have to be reduced for practical applications.

Thus, it may appear at the first glance that a high speed optical switching operation can be realized by means of an active transparent optical waveguide. However, in reality, since electrons are excited from a valence band to a conduction band as a result of two-photon absorption, the actual speed of operation is restricted by the carrier accumulation. More specifically, while electrons and holes excited to a high energy level as a result of two-photon absorption may lose part of their energy and become relaxed as they fall close to the bottom of the conduction band or the top of the valence band within a short period of time of several picoseconds, they are still excessively excited in that state. While only few carriers may be excited by a single pulse, there may be given rise to a large number of excited carriers as the pulse is repeated at high speed until a saturated state is produced for absorption so that the response may become fluctuated with a time constant corresponding to the carrier lifetime (several nanoseconds) depending on the pattern of excitation.

On the other hand, in an optical control type optical switch using an active transparent optical waveguide, values close to the gain peak wavelength may advantageously be selected for the wavelengths of both the signal light and the control light in order to suppress noises, although such values that are close to each other make it difficult to separate the signal light from the control light. Additionally a semiconductor optical control type optical switch is accompanied by a vital drawback of being incapable of allowing a sufficiently large extinction ratio for optical output regardless if it comprises an active transparent optical waveguide. Now, these problems will be discussed below by referring to a nonlinear directional coupler (NLDC) type optical switch comprising an active transparent optical waveguide as described in an available research document (S. G. Lee et al., Appl. Phys. Lett., vol.64, pp.454–456, 1994).

FIG. 2 of the accompanying drawings shows a schematic cross sectional view of a conventional NLDC type optical switch formed on an n-type GaAs substrate 701. An active layer 701 formed on the substrate is in fact an GaAs/AlGaAs multiple quantum well layer which is sandwiched by an n-type AlGaAs clad layer 703 and a p-type AlGaAs clad layer 704. A p-type GaAs contact layer 705 is formed on the p-type AlGaAs clad layer 704. A pair of stripe-shaped mesa regions 706a and 706b are formed on the p-type AlGaAs clad layer 704 and the p-type GaAs contact layer 705 to define respective channels for the optical waveguide. The mesa regions have a width of 3 μm and a height of 0.9 μm and are separated from each other by a distance of 2 μm. The device has an overall length of 1.3 mm. An upper electrode 707 is arranged on the upper surface of the device including those of the mesa regions, while a lower electrode 708 is formed under the substrate so that a substantially transparent condition can be established for the optical input by injecting carriers into the active layer 702.

The optical input is pulsed light having a pulse width of 200 fs and the device is so designed as to be switched to select an output channel depending on the energy level of the optical input regardless if signal light or control light. The time required for recovery is less than 1 picosecond. FIG. 3 of the accompanying drawings shows the input energy dependency of the output ratio of each of the channels. In FIG. 3, the broken lines are for the TE mode and it may be appreciated that the output ratio varies between 1:3 and 1.7:1, whereas the solid lines are for the TM mode, where the output ratio varies between 1:3 and 1.4:1. Reportedly, the outputs of the two channels cross each other at 6 pJ for the TE mode.

No perfect switching operation can be realized between 0:1 and 1:0 in the above instance. One of the reasons for it is that the device length does not necessarily agree with the complete coupling length of the directional coupler at the time of weak excitation multiplied by a natural number. Even if such discrepancy does not exist and an output ratio of 0:1 is realizable at the time of weak excitation, an output ratio of 1:0 can never be achieved for an NLDC because the equivalent refractive index at each observable point depends on the intensity of light at that point and the channels are coupled so that the ratio of the intensities of light of the channels and therefore the extent of coupling at each point change as a function of the intensity of input light to severely damage the uniformity and the symmetry of the directional coupler and make it substantially impossible to put the device in perfect condition. This also holds true for an asymmetric Mach-Zehnder interferometer type optical switch, where a large the extinction ratio cannot be obtained at the time of strong excitation because the waveguide performance varies at each branch point between the time of weak excitation and that of strong excitation.

The above cited research document also describes a case where pump light and probe light are orthogonally polarized. Control light and signal light may be separated by such a technique. Polarization beam splitter, however, is difficult to be integrated on a semiconductor substrate, so that the separation of control light and signal light is difficult on a practical basis.

The above problems may be summarized as follows.

A conventional optical control type high speed semiconductor optical switch is not capable of carrying out switching operations at high speed with a lower power level. Particularly, if the optical switch is one that utilizes the nonlinearity in the active transparent semiconductor optical waveguide, the high speed repetitive operation capability of the device is restricted by the lifetime of carriers accumulated by two-photon absorption (TPA). Additionally, a conventional optical control type optical switch cannot satisfactorily switch the destinations of optical signal output and separate control light and signal light if quick and highly efficient optical switching operation is sought for.

Thus, there are good reasons for expecting a high speed/high efficiency optical control type optical switch that is not restricted by the carrier lifetime.

Meanwhile, it may be appropriate to utilize the technology of optical frequency-division multiplexing for transmitting and processing a vast amount of data by optical fiber if the large bandwidth capabilities of optical fiber is to be fully exploited. Therefore, semiconductor optical devices that can directly change the optical wavelength (wavelength conversion devices) without carrying out a process of photoelectric conversion are expected to become practically feasible in order to realize large scale and efficient optical frequency division multiplexed networks. A wavelength conversion device may be used for an optical demultiplexer designed to select a signal with a specific timing through wavelength conversion in an optical time division multiplexed transmission system that utilizes ultrahigh speed pulses.

A wavelength conversion device to be used for any of these applications has to meet the requirements of a wide wavelength conversion band, an ability of continuous wavelength conversion within the band, response to quickly modulated signals and a high conversion efficiency. Efforts have been and are currently being paid to develop wavelength conversion devices that utilize the four wave mixing in traveling wave type semiconductor laser amplifiers for wavelength conversion in order to meet the above requirements.

FIG. 4 of the accompanying drawing schematically shows a wavelength conversion system comprising a conventional wavelength conversion device that utilizes the four wave mixing in a traveling wave type semiconductor laser amplifier for wavelength conversion. Note that optical spectra are shown for respective stages of operation.

Referring to FIG. 4, the wavelength conversion device comprises a semiconductor optical waveguide having a double hetero structure and realized by sandwiching an InGaAs active layer 802 with a p-type InP clad layer 803 and an n-type substrate 801 that also operates as an n-type clad layer, a pair of electrodes 804, 805 for injecting an electric current into the active layer 802 and anti-reflection films 806 for preventing any reflection of light at the opposite ends of the semiconductor optical waveguide.

With a wavelength conversion device having a configuration as described above, a stimulated emission gain is given rise to as a result of population inversion of carriers injected into the active layer 802 at high concentration to consequently amplify any light traveling through the optical waveguide with a wavelength found within the gain band. Additionally, since anti-reflection films 806 are arranged at the opposite ends of the optical waveguide, any laser oscillation is suppressed to allow optical amplification to be realized with a large gain if a strong electric current is being injected.

When exciting light W1 having an angular frequency of ω1 and signal light W2 having an angular frequency of ω2 are combined and applied to the wavelength conversion device, a change equal to angular frequency Ω=ω1−ω2 takes place in the optical field strength as a result of b eats produced by the exciting light and the signal light.

Then, light with an angular frequency of ω will be modulated for both intensity and phase by an angular frequency of Ω to give rise to components of angular frequency ω±nΩ because of the nonlinear responsiveness of gain and refractive index relative to the internal optical field strength of the InGaAsP active layer 802.

If it is assumed here that the power P1(0) of the exciting light is by far greater than the power P2(0) of the signal light at the input side end z=0, then conjugate light W3 having an angular frequency of ω3 (=ω1+Ω) appears with the exciting light W1 having an angular frequency of ω1 and the signal light W2 with the angular frequency of ω2 at the output side end z=1, and the conjugate light W3 having an angular frequency of ω3 is selectively picked up by means of a narrow band optical filter 807. Since the output power level of conjugate light is low, it is normally amplified by an optical amplifier 808 before use.

When the signal light is modulated for intensity or frequency, the conjugate light is also produced in a modulated state in terms of intensity or frequency. In other words, the light that is the signal carrier wave is converted for wavelength, although the spectrum of the conjugate light is inverted from that of the original signal light.

This phenomenon can be explained by four wave mixing of ω3=ω1+ω1−ω2, where ω1 may be greater or smaller than ω2. The wavelength of the signal can be converted to any value found within the band by tuning ω1. According to J. Zhou, et al., IEEE Photonics Technol. Lett., vol.6, No.1, pp.50–52, 1994, the wavelength conversion efficiency η is expressed on a dB basis by the equation below.

$$\eta = 10\log_{10}(P3(1)/P2(0)) \qquad (1)$$
$$= 3G + 2I_p + 20\log_{10}\left|\sum_{m=1}^{3} C_m/(1-i\Omega\tau_m)\right|$$

where G[dB] is the gain of the amplifier and $I_p$[dB] is the power of the exciting light which is equal to $10\log_{10}P1(0)$, while $C_m$ and $\tau_m$ (m=1, 2, 3) respectively represent the complex coupling coefficients and the time constants of three major causes for producing four wave mixing.

The conversion efficiency η is normally a large number because it is proportional to the cube of amplification gain G and the square of the power $I_p$ of exciting light.

The three major causes of four wave mixing are change of carrier density (m=1), carrier heating (n=2) and spectral hole burning (m=3).

Four wave mixing caused by change of carrier density is seen when the number of carriers in areas having a strong optical field is reduced by stimulated emission to reduce the gain and change the refractive index. The time constant for it is controlled by the effective carrier lifetime, taking stimulated emission into consideration.

Carrier heating appears when the carrier temperature is raised as a result of intra-band absorption of light and/or stimulated emission to change the gain and the refractive index. The time constant for it is controlled by the time required for carriers to become relaxed to show the energy distribution pattern of lattice temperature as a result of inelastic collisions and other phenomena.

Spectral hole burning is observed when the energy distribution pattern of carriers is shifted from Fermi distribution also as a result of intra-band absorption of light and/or stimulated emission to change the gain and the refractive index. The time constant for it is controlled by the time required for carriers to become relaxed and return to show the Fermi distribution as a result of intercarrier collisions and other phenomena.

FIG. 5 is a graph showing the Ω dependency of the wavelength conversion efficiency η of a tensile strained InGaAs/InGaAsP multi-quantum well traveling wave type semiconductor laser amplifier. In the graph, the small squares are for ω2>ω3, whereas small circles are for ω2<ω3. It shows that wavelength conversion can be realized over a wide range of 3.4THz (a wavelength difference of 27 nm).

By fitting the graph to the equation (1) above, $C_1=0.24e^{-i1.30}$ and $\tau_1=200$ ps, $C_2=0.0027e^{-i1.30}$ and $\tau_2=650$ fs and $C_3=0.00048e^{-i1.53}$ and $\tau_3=50$ fs are obtained.

The cutoff frequencies (wavelength differences) that correspond to the time constants $\tau_1$, $\tau_2$ and $\tau_3$ are 800MHz (0.0064 nm), 240GHz (1.9 nm) and 3.4THz (27 nm) respectively.

The dotted line in FIG. 5 shows the slope of 20 dB/dec. If only changes in the carrier density is involved, the wavelength conversion efficiency η falls along this line. Therefore, the upward deviation of the conversion efficiency lines from 1 nm on is caused by carrier heating, whereas the deviation from 20 nm on is attributable to spectral hole burning. While carrier heating plays a major role in the wavelength shift between 1 and 10 nm, the conversion efficiency remains between −50 dB and −65 dB because the absolute value of $C_2$ is not sufficiently large.

Differently stated, while the technique of wavelength conversion by means of a conventional wavelength conversion device utilizing the four wave mixing effect of a known traveling wave type semiconductor laser amplifier is effective for a conversion over a large bandwidth of more than 10 nm of wavelength difference, thanks to the nonlinearity of carrier heating, it is poorly effective for a conversion over 1 nm of wavelength difference because the nonlinearity of carrier heating is not sufficiently remarkable.

Therefore, in a wavelength conversion with a wavelength difference greater than 1 nm, the power of conjugate light is found low respect to the power levels of exciting light, signal light and noises of the semiconductor laser amplifier. More specifically, the power level of conjugate light is lower than the output power level of signal light by about 20 dB and that of exciting light by 40 dB. The difference between the noise level of amplified spontaneous emission (AES) and the power level of conjugate light is somewhere around 20 dB at most.

Thus, the extinction ratio of the narrow band optical filter 807 for picking up only conjugate light ($\omega_3$) from the optical output ($\omega_1$, $\omega_2$, $\omega_3$) has to be rigorously defined, although the problem of a poor signal to noise ratio (S/N ratio) is nonetheless aggravated.

The above problems may be summarily described as follows.

Since a conventional wavelength conversion device utilizing the four wave mixing effect of a known traveling wave type semiconductor laser amplifier does not remarkably show nonlinearity by carrier heating, the wavelength conversion efficiency for greater than 1 nm of wavelength difference is rather small. Therefore, the extinction ratio of the narrow band optical filter of the device has to be rigorously defined, although the problem of a poor signal to noise ratio (S/N ratio) is nonetheless aggravated.

Therefore, there are good reasons for expecting a high efficiency wavelength conversion device.

Meanwhile, it may be appropriate to utilize the technology of optical frequency-division multiplexing (optical FDM) and that of optical time-division multiplexing (optical TDM) for transmitting and processing a vast amount of data by optical fiber if the large bandwidth capabilities of optical fiber is to be fully exploited. Therefore, the development of optical devices having novel functional features is thought to be indispensable to realize large and effective optical FDM networks and optical TDM networks.

For instance, in an optical FDM/TDM network, wavelength conversion nodes as illustrated in FIG. 9 of the accompanying drawings are expected to take a vital role in the signal switch and the reutilization of wavelength channels. Referring to FIG. 9, when signal light (wavelength $\lambda_q$ and strong exciting light $\lambda_p$ are made to enter a wavelength conversion device 901, signal conjugate light (wavelength $\lambda_c$) is also produced by four wave mixing. A wavelength conversion output having a sufficient strength can be obtained by picking up only the $\lambda_c$ component by means of a narrow band wavelength filter 902 and amplifying it by means of an optical fiber amplifier 903.

However, any known tunable wavelength filters can hardly switch $\lambda_c$ at high speed. Mechanical tunable wavelength filters and tunable wavelength filters that utilize acousto-optical effects are too slow for switching operations and cannot feasibly be used for the above applications. While tunable wavelength filters realized by utilizing distributed feedback (DFB) type semiconductor lasers and distributed Bragg reflector (DBR) type semiconductor lasers are capable of high speed switching within, they are not suitable as filters for short optical pulse signals because they are of a resonant type and apt to spread the pulse width by multiple reflections. Thus, the only feasible way of switching $\lambda_q$ at high speed by means of any known techniques is to feed the output of a wavelength conversion device 901 to a plurality of narrow band optical filters and select one of the outputs thereof and this method is an inefficient one in any sense of the word.

It may be needless to say that the technological development of optical FDM/TDM networks, to say nothing of that of tunable wavelength filters, is highly dependent on novel optical devices developed on new theories and provided with new functional features.

Thus, there are good reasons for expecting a high efficiency semiconductor optical waveguide device (such as a tunable wavelength filter) that cannot be realized by conventional techniques in order to realize optical TDM/FDM networks for the coming multimedia age.

SUMMARY OF THE INVENTION

Therefore, an object of the present invention is to provide a high speed/high efficiency optical control type optical switch that is not restricted by the carrier lifetime.

Another object of the present invention is to provide an optical control type optical switch that can easily separate control light and signal light and can substantially perfectly select the destination of the signal light output by switching.

Still another object of the present invention is to provide a wavelength conversion device that operates with a conversion efficiency higher than that of any comparable conventional devices.

A further object of the present invention is to provide a semiconductor optical waveguide device that can also be applied to multifunctional light sources and light receiving devices.

As described in detail hereinafter, the essence of the first and second aspects of the present invention lies in that, in an optical control type optical switch that utilizes the nonlinearity of an active transparent optical waveguide, the layered structure of the optical waveguide is at least partly made of a material whose resonant wavelength of intra-band absorption is substantially equal to the wavelength of incident light so that the nonlinearity due to intra-band absorption is made more remarkable than the nonlinearity due to two-photon absorption.

According to the first aspect of the present invention, there is provided an optical control type optical switch in which at least one of destination, intensity, wavelength, and phase of a signal light output is controlled by a control light, comprising a stripe-shaped semiconductor optical waveguide, part of the semiconductor optical waveguide being an active layer, means for inputting and outputting the signal light and the control light, and means for regulating the density of electrons and holes of the active layer so as to establish an equilibrium between loss and gain of the semiconductor optical waveguide at and near the wavelength of the signal light and the control light, wherein part of the semiconductor optical waveguide is made of a material having an intra-band resonant wavelength substantially equal to the wavelength of the control light.

For the purpose of the present invention, intra-band absorption specifically refers to inter-valence band absorption from a heavy or light hole band to a spin-orbit separation band and inter-subband absorption in quantum well.

According to the second aspect of the present invention, there is provided an optical control type optical switch comprising signal light branching means for receiving signal light and branching it to first and second intermediate optical path, a control light input waveguide for receiving control light, a first optical coupler for coupling the control light input waveguide and the first intermediate optical path respectively to first and second optical waveguides, a second optical coupler for coupling the first and second optical waveguides respectively to a third intermediate optical path and a control light output optical path, a reference optical path for transmitting the light branched to the second intermediate optical path and an output optical coupler for coupling the third intermediate optical path and the reference optical path respectively to first and second signal light output optical paths, wherein the stretch between the first optical coupler and the second optical coupler constitutes a first Mach-Zehnder interferometer for mainly transmitting the signal light to the third intermediate optical path regardless of the presence or absence of control light and the phase of the signal light transmitted to the first and second signal light output optical path is shifted by the nonlinear optical effect of the first and second optical waveguides, whereas the phase of the signal light traveling through the third intermediate optical path is shifted according to the presence or absence of control light so as to select the destination of the principal signal light output of the output optical coupler by switching.

Some of the preferable modes of realization of the present invention include the following.

(1) The signal light branching means may form a Y branch or be a 1:1 optical coupler. In order for the first Mach-Zehnder interferometer to transmit the signal light mainly to the third intermediate optical path regardless of the presence or absence of control light, the first and second optical couplers have to be 1:1 optical couplers and the first and second optical waveguides have to be symmetrical relative to each other.

(2) A second Mach-Zehnder interferometer similar to the first Mach-Zehnder interferometer has to be formed by the stretch between the second intermediate optical path and the reference optical path. More specifically, it is preferable that the second Mach-Zehnder interferometer is constituted by a third optical coupler for coupling the second control light input waveguide and the second intermediate optical path respectively to the third and fourth optical waveguides and a fourth optical coupler for coupling the third and fourth optical waveguides respectively to the reference optical path and the second control light output optical path and inserted between the second intermediate optical path of the output of the signal light branching means and the input of the reference optical path of the output optical coupler in order to provide symmetry with the optical path of the first Mach-Zehnder interferometer.

(3) The first and second optical waveguides are constituted by active semiconductor waveguides provided with electron current injection means and biased so as to establish an equilibrium between the gain and the loss relative to low-power light having the wavelength of the control light. In an optical control type optical switch comprising a second Mach-Zehnder interferometer as described above, it is preferable that the third and fourth optical waveguides are configured same as the first and second optical waveguides respectively.

(4) The entire device is monolithically formed on a semiconductor substrate.

(5) Means are provided to regulate the phase of the light introduced into the second optical coupler from the first optical waveguide and that of the light introduced into the second optical coupler from the second optical waveguide.

(6) Means are provided to regulated the phase of the light introduced into the output optical coupler from the reference optical path and that of the light introduced into the output optical coupler from the third intermediate optical path.

Carriers (electrons and holes) are present at high density in the inside of the semiconductor optical waveguide of an optical control type semiconductor optical switch according to the first aspect of the invention as a result of electric current injection. Since the optical waveguide is biased to establish an equilibrium between the rate of carrier generation caused by interband absorption and that of carrier loss attributable to stimulated emission for the wavelength of exciting light. Therefore, the number of carriers in the optical waveguide does not change significantly if exciting light is applied there anew. On the other hand, since the wavelength of exciting light and the resonant wavelength of interband absorption is substantially equal to each other, part of the carriers absorb the energy of exciting light to become excited to a higher energy level and the carriers that are originally there are excited within the band so that the number of carriers does not change as a whole. As the energy distribution pattern of carriers changes, the refractive index and the transmission coefficient change greatly and abruptly, although excited hot carriers restore the original equilibrium within a short period of time because of the intra-band relaxation. In other words, although the refractive index and the transmission coefficient can change greatly as soon as an exciting pulse is applied to the optical waveguide, they are restored to the respective original levels within several picoseconds after the removal of the exciting pulse.

Strictly speaking, the carrier density is also changed slightly by incidental two-photon absorption. However, since the intra-band absorption is enhanced by resonance, the optical waveguide can be used with exciting light having a power level lower than that of its counterpart used for a conventional active transparent waveguide to suppress the influence of two-photon absorption so that the influence of a lasting change in the response due to accumulation of carriers can be effectively suppressed in any quick repetitive operation.

In an optical control type semiconductor switch according to the second aspect of the present invention, the signal light branching means branch the signal light to a first component fed to the first intermediate optical path and designed to interfere with control light and a second component fed to the second intermediate optical path to make reference light to a ratio of 1:1. Then, the signal light is branched by the first optical coupler to the first and second optical waveguides to a ratio of 1:1. Furthermore, if the control light from the first control light input waveguide is entered in synchronism with the signal light, the control light is also branched by the first optical coupler to the first and second optical waveguides to a ratio of 1:1. If such control light is present, the phase of the signal light traveling through the first optical waveguide is shifted by $\phi$ as a result of nonlinear optical effect. If the third order nonlinearity is involved, the phase shift is proportional to the power of control light. Then, the phase of the signal light traveling through the second optical waveguide is also shifted by $\phi$.

As described above, the relationship between the phases of the two light introduced into the second optical coupler is constant regardless of presence or absence of control light. Since the second optical coupler is a 1:1 coupler like the first optical coupler, the signal light is sent to the third intermediate optical path due to the reciprocity theorem regardless of presence or absence of control light. On the other hand, the control light is branched to the control light output optical paths. As a result, the signal light and the control light are separated from each other. Note that, since the signal light is by far weaker than the control light, the phase shift of itself is negligible and that, since the first and second optical couplers are passive couplers with a small nonlinearity, the branching ratio is not substantially affected by the presence of control light.

The phase of the signal light introduced into the output optical coupler from the second optical coupler by way of the third intermediate optical path is shifted by $\phi$ if there is control light coming from the first control light input waveguide. On the other hand, the phase of the reference signal light branched to the second intermediate optical path is constant regardless of presence or absence of control light coming from the first control light input waveguide and the light is introduced into the output optical coupler from the reference optical path.

Thus, the output ratio of the signal light sent from the output optical coupler into the first output optical path to the one sent into the second output optical path is altered by the phase of the signal light coming from the third intermediate optical path and the one coming from the reference optical path. If, now, it is so designed that the output is sent to the first output optical path in the absence of control light and the phase shift $\phi$ by control light is equal to $\pi$ or $\pi$ multiplied by an odd number, then the destination of the output is completely switched to the second output optical path by control light. In this way, the output ratio of signal light can be substantially perfectly switched from 0:1 to 1:0 without the risk of mingling control light into signal light.

However, it should be noted that the signal light of the third intermediate optical path and that of the reference optical path may show discrepancy in terms of intensity and pulse width to baffle perfect switching because of the existence of the first and second optical waveguides and the first and second optical couplers. If such is the case, the signal light sent into the output optical coupler from the third intermediate optical path and the one sent into the output optical coupler from the reference optical path can be made equivalent to ensure perfect switching by arranging a second Mach-Zehnder interferometer having a configuration same as that of the first Mach-Zehnder interferometer on the reference optical path side. When the optical switch is used as a router, it is not necessary to introduce control light into the second Mach-Zehnder interferometer from the second control light input waveguide.

High speed optical switching can be realized and will not be affected by the carrier lifetime if the first and second optical waveguides are active semiconductor waveguides that are so biased as to establish an equilibrium between the gain and the loss relative to low-power light having the wavelength of control light. If semiconductor waveguides are used for the first and second optical waveguides of a device according to the present invention, they are preferably active transparent optical waveguides to minimize the loss and maximize the nonlinearity because the optical waveguide section of the device is apt to be rather long. If the third and fourth optical waveguides are employed, they are preferably also active transparent optical waveguides as the first and second ones.

If an optical control type optical switch according to the present invention is monolithically formed on a semiconductor substrate, the Mach-Zehnder interferometers can be symmetrically arranged with ease. If such is the case, since the number of contact points of the optical waveguides is reduced and the components are uniformly affected by temperature change, the device can enjoy enhanced stability and reliability to say nothing of a reduced connection loss and the possibility of downsizing and lowering the manufacturing cost.

If the first and second optical waveguides show small discrepancy in the symmetrical arrangement, an imperfect separation of signal light and control light may result in the second optical coupler, although such discrepancy can be compensated by inserting means for shifting the phase of one of the optical waveguides relative to that of the other one. This description holds true also for the second Mach-Zehnder interferometer constituted by the third and fourth optical waveguides and for the third Mach-Zehnder interferometer constituted by the first Mach-Zehnder interferometer and the reference optical path (or the second Mach-Zehnder interferometer). Particularly if the signal branching means is designed to realize symmetrical Y branching and hence the branched two optical paths are perfectly symmetrical, the branching ratio of the first output optical path to the second one is 1:1 in the absence of control light. This means that the phase of the output of either one of the optical paths has to be biased by $\pi/2$ relative to the phase of the output of the other one from the very beginning to allow only one of the signal light output optical paths to produce its output. Such phase regulating means may be realized by arranging a phase modulator on the optical waveguides or introducing biasing light from the second control light input waveguide.

The third aspect of the present invention as described hereinafter is essentially characterized by the use of a semiconductor optical waveguide for a wavelength conversion device in order to enhance the conversion efficiency, the semiconductor optical waveguide comprising a semiconductor layer having a resonant wavelength of intra-band absorption arranged within the gain bandwidth of the traveling wave type semiconductor laser amplifier of the device.

More specifically, a wavelength conversion device according to the third aspect of the present invention comprises a traveling wave type semiconductor laser amplifier having a semiconductor optical waveguide formed by sandwiching an active layer between a pair of clad layers, wherein light having an angular frequency different from the light introduced into the semiconductor optical waveguide is generated by four wave mixing in the semiconductor optical waveguide, wherein the semiconductor optical waveguide has a semiconductor layer having an intra-band absorption resonant wavelength arranged within the gain band of the traveling wave type semiconductor laser amplifier.

The semiconductor layer may be the active layer itself, part of the clad layers or a layer independent from the active layer and the clad layers so long as it covers part of the power distribution zone of light guided through the semiconductor optical waveguide.

For the purpose of the present invention, intra-band absorption specifically refers to inter-valence band absorption from a heavy or light hole band to a spin-orbit separation band and inter-subband absorption of quantum well.

Four wave mixing is a nonlinear process of mixing three input lights in a nonlinear medium to produce a fourth output light. The three input light waves are two exciting lights and a signal light, of which the two exciting lights may be same. If such is the case, the number of input lights is in fact only two.

Assume here that a first light having an angular frequency of $\omega_1$ and a second light having an angular frequency of $\omega_2=\omega_1-\Omega$ (where $\Omega$ is not equal to zero) found within the gain wavelength band of the traveling wave type semiconductor laser amplifier are introduced into the device. Then, a third light having an angular frequency of $\omega_3=\omega_1+\Omega$ is generated and produced as a result of four wave mixing in the semiconductor optical waveguide.

The nonlinear susceptibility of a wavelength conversion device according to the third aspect of the present invention attributable to inter-subband transition of the conduction band and the valence band and/or intra-band transition (intra-band absorption) such as inter-valence band transition is greater than the nonlinear susceptibility attributable to inter-band transition.

If the wavelength of incident light agree with the resonant wavelength of intra-band absorption, the carrier energy distribution within the band changes remarkably as a result of intra-band resonant absorption to consequently change the absorption coefficient and the refractive index so that a conversion efficiency higher than the conversion efficiency (=α×complex coupling coefficient, where α is a constant) given rise to by carrier heating when no intra-band resonant absorption takes place can be obtained.

Thus, a wavelength conversion device according to the present invention and comprising a semiconductor optical waveguide having semiconductor layer with a resonant wavelength of intra-band absorption arranged within the gain bandwidth of the traveling wave type semiconductor laser amplifier of the device can provide a conversion efficiency higher than that of conventional wavelength conversion devices without intra-band resonant absorption.

With a wavelength conversion device according to the present invention, carriers excited to a high energy level return to the original energy level by relaxation as described below.

The process of relaxation involves transition to a lower energy band through collisions with phonons, relaxation to the Fermi distribution through collisions of carriers and relaxation of the carrier temperature to the lattice temperature through collisions with phonons. These modes of relaxation are basically identical with the modes of relaxation from spectral hole burning and from carrier heating. The duration of the process of relaxation is in fact a function of relaxation from carrier heating that proceeds most slowly of all the above listed modes but takes only as short as several hundred femtoseconds to several picoseconds. Therefore, even if exciting light and signal light show a large difference in wavelength, the fall of the conversion efficiency remains very small over a large bandwidth.

Thus, according to the third aspect of the invention, there is provided a wavelength conversion device that can carry out wavelength conversion highly efficiently over a large bandwidth.

A semiconductor optical waveguide device according to the fourth aspect of the present invention comprises an optical waveguide constituted by a second semiconductor optical waveguide layer made of a material having a bandgap sufficiently greater than that of a first semiconductor optical waveguide layer including an active layer or that of the active layer itself, means for injecting an electric current into the active layer and means for electrically controlling the resonant wavelength of intra-band absorption of the second semiconductor optical waveguide layer, characterized in that the resonant wavelength of intra-band absorption of the second semiconductor optical waveguide layer is arranged within the stimulated emission gain wavelength bandwidth given rise to by electric current injection into the active layer.

In the semiconductor optical waveguide device as described above, the means for controlling the resonant wavelength of intra-band absorption of the second semiconductor optical waveguide layer may be operated as means for applying an electric field to the second semiconductor optical waveguide layer.

A material having a bandgap more than twice, preferably three times, as large as that of the active layer of the first semiconductor optical waveguide layer may be used for the second semiconductor optical waveguide layer. Materials that can be used for the first semiconductor optical waveguide layer to suitably meet the above requirement include InP and InGaAsP, while materials that can be used for the second semiconductor optical waveguide layer to meet the above requirement include InGaN, GaN and AlN. The second semiconductor optical waveguide layer may have a quantum well structure. For the purpose of the present invention, intra-band resonant absorption specifically refers to inter-subband absorption of quantum well, and inter-valence band absorption.

A semiconductor optical waveguide device according to the present invention can be realized in a number of different modes as described below to provide different functional features. In a mode of realization, the second semiconductor optical waveguide layer is arranged such that the spectrum of intra-band resonant absorption may be varied by applying an electric field. If a semiconductor optical waveguide device according to the present invention involves inter-subband absorption, an asymmetric well structure may be used in order to realize a large change in the inter-subband transition energy transition by applying an electric field.

The second semiconductor optical waveguide lay may be at least partly doped with one or more than one impurities. The first and second semiconductor optical waveguide layers may be placed close to each other in a layered arrangement or, alternatively, serially connected to each other. Still alternatively, the optical waveguide may comprise a portion constituted by only either one of the first and second semiconductor optical waveguide layers and a portion where the two layers are placed close to each other in a layered arrangement. Still alternatively, a third semiconductor optical waveguide layer may be arranged between the first and second semiconductor optical waveguide layers.

A single or more than one intra-band absorption resonant wavelengths of the second semiconductor optical waveguide layer may be found within the gain bandwidth of the active layer. The second semiconductor optical waveguide layer may be divided into a plurality of zones along the optical waveguide that are respectively provided with independent means for controlling the intra-band absorption resonant wavelength by applying an electric field to the second optical waveguide layer. If such is the case, the zones may have different respective intra-band absorption resonant wavelengths. Of the plural zones, some may have a relatively large well width, whereas the rest may have a relatively small well width.

The optical waveguide may be provided with means for preventing multiple reflections of traveling light from taking place along the traveling direction. If such is the case, a semiconductor optical waveguide device according to the present invention is a traveling wave type optical waveguide device. Such means specifically refers to formation of an anti-reflection film on each of the input and output facets of the device, use of a window structure, monolithic integration of the optical waveguide with other devices and angled facets relative to the optical waveguide.

If a semiconductor optical waveguide device is used as a resonance type device such as a semiconductor laser, it may be provided with optical feedback means in order to give rise to resonance of light having a specific wavelength. For the optical feedback means, a diffraction grating, a cleaved surface or an etched surface may be used.

In a semiconductor optical waveguide device according to the fourth aspect of the present invention, a stimulated emission gain may be produced over a wide wavelength band near the band edge energy level by injecting an electric current into the active layer of the first semiconductor optical waveguide layer. Since the second semiconductor optical waveguide layer is constituted by a semiconductor layer having a bandgap sufficiently greater than that of the active layer, it does not give rise to any inter-band absorption but produces intra-band absorption for light having a wavelength corresponding to the gain band wavelength of the active layer. Since the magnitude of intra-band absorption depends on the carrier density of the second semiconductor optical waveguide layer, a desirable level may be obtained by selecting an appropriate concentration for the impurities to be doped. The intra-band resonant absorption spectrum has a width as small as tens of several meV at most, which is by far smaller than the width of the interband absorption spectrum and that of the gain spectrum of the active layer.

Since light being transmitted through the optical waveguide is sensitive to both any gain of the active layer and absorption in the second semiconductor optical waveguide layer, gain holes may be produced in the gain spectrum obtained as a net result involving the gain of intra-band absorption. If a plurality of intra-band absorption resonant wavelengths are provided within the gain band of the active layer, an active wavelength filter having a variety of transmission spectra may be formed by appropriately arranging overlapped and/or isolated gain holes. Since the active layer has a gain, a gain is produced in the transmission wavelength range whereas a loss is provided in the cut-off wavelength range.

As an electric field is applied to the second semiconductor optical waveguide layer, the gain holes change their positions and sizes. The transmissivity may be controlled in a more sophisticated way if the second semiconductor optical waveguide layer and the means for applying a voltage thereto are divided into a plurality of zones. Any change in the intra-band absorption spectrum instantaneously follows up the change in the electric field, be it caused by inter-subband absorption of quantum well or by inter-valence band absorption.

If the device is of the traveling wave type provided with means for preventing multiple reflections of light along the traveling direction, the high speed optical pulse having a transmission wavelength is transmitted without entailing any strained or divided pulse waveform attributable to multiple reflections. When an optical pulse having a cut-off wavelength is introduced, carriers excited to a high energy level by intra-band absorption is restored to the original energy level by relaxation within a very short period of several picoseconds even if they are not drawn out to the outside by an electric field, so that consequently no pattern effect is produced by saturated absorption.

Because the absorption coefficient for a specific wavelength is changed by applied an electric field to the second semiconductor optical waveguide layer, a semiconductor optical waveguide device according to the present invention can be applied to an optical intensity modulator.

Generally speaking, if an absorption spectrum is modified remarkably by applying an electric field, the refractive index of the wavelength close to that also changes significantly. In view of this phenomenon, it will be understood that a semiconductor optical waveguide device according to the present invention can be applied to a device that utilizes changes in the refractive index. Since an absorption spectrum has a spectral width smaller than that of inter-band absorption, a phase modulator showing a small change of absorption and a large change of refractive index can be realized by using a wavelength located just outside that of the absorption peak.

Additionally, by appropriately selecting a wavelength and a voltage to be applied, the ratio ($\alpha$ parameter) of a change in the absorption coefficient to a change in the refractive index produced by the power of control light and an electric field can be modified significantly.

Still additionally, if the present invention is applied to an optical control type optical switch that utilizes cross phase modulation within a traveling wave type optical amplifier or a wavelength conversion device that utilizes four wave mixing and gain saturation within a traveling wave type optical amplifier, the absorption coefficient, the conversion efficiency and other operating parameters of such a device can be controlled by way of external voltage terminals.

Still additionally, a photodetector having a high speed wavelength tuning capability can be realized by providing additional means to draw carriers with a high energy level produced by intra-band absorption to the outside by resonance tunneling or some other technique.

Still additionally, if the present invention is applied to a resonance type optical waveguide device by using optical feedback means, it may be used for a resonance type wavelength filter, a resonance type optical control switching device or a multifunctional light source. For instance, if the second semiconductor optical waveguide layer is arranged within the resonator, it may be used for a tunable wavelength laser that can quickly change the wavelength, a mode-locked laser wherein the second semiconductor optical waveguide layer is constituted by a saturable absorber whose performance can be controlled by a voltage or a laser light source that can generate short pulses by using a loss switch. If the second semiconductor optical waveguide layer is arranged outside the resonator, a light source comprising integrated intensity modulators or integrated phase modulators may be realized.

If a material having a large bandgap generously exceeding the twice of the bandgap of the active layer is used for the second semiconductor optical waveguide layer, changes in the carrier density of the second semiconductor optical waveguide layer attributable to absorption of light being transmitted through the optical waveguide by two-photon absorption can be prevented from taking place so that the slow fluctuation of the response restricted by the carrier lifetime (2 several hundred picoseconds) is suppressed and fast and stable operation is realized.

Generally, multiple photon absorption that absorb N photons can be prevented from taking place by reducing the wavelength of the interband absorption in the second semiconductor optical waveguide layer to a level sufficiently shorter than 1/N of the optical wavelength that is being used.

In short, a semiconductor optical waveguide device according to the present invention can be used for a light source, a photodetector device, an optical waveguide device for modifying the optical spectrum, the intensity of light or the phase of light or a device having complex functional features.

To summarize up, the semiconductor optical waveguide device comprises a stripe-shaped semiconductor optical waveguide, part of the semiconductor optical waveguide being an active layer producing gain by electric current injection, and another part of the semiconductor optical waveguide being an intra-band resonant absorption layer in which an intra-band absorption resonant wavelength is arranged within the gain band of the active layer, and means for injecting electric current into the active layer.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 2 is a schematic cross sectional view of a conventional nonlinear directional coupler;

FIG. 3 is a graph showing the output performance of a conventional nonlinear direction coupler;

FIG. 4 is a schematic view of a wavelength conversion system using a conventional wavelength conversion device;

FIGS. 17A through 17F are schematic cross sectional views of a Mach-Zehnder interferometer type optical switch in different manufacturing steps according to the third embodiment of the present invention;

FIG. 18 is a schematic illustration of an optical control type optical switch according to a fourth embodiment of the present invention, showing its configuration;

FIG. 20 is a pulse timing chart of the operation of the optical control type optical switch of FIG. 18;

FIG. 21 is a schematic illustration of an optical demultiplexer realized by applying the optical control type optical switch of FIG. 18, showing its configuration;

FIG. 22 is a graph showing the input-output relationship of an analog optical modulator realized by applying the optical control type optical switch of FIG. 18;

FIG. 23 is a schematic perspective view of a wavelength conversion device according to a fifth embodiment of the present invention;

FIG. 24 is a schematic illustration of the conduction band of the strained quantum well active layer of the optical waveguide of the wavelength conversion device of FIG. 23, showing its structure;

FIG. 27 is a schematic perspective view of a wavelength conversion device according to a sixth embodiment or a tunable wavelength filter according to an eighth embodiment of the present invention;

FIGS. 28A and 28B are graphs showing transmission spectrums of the tunable wavelength filter of FIG. 27;

FIG. 33 is a table showing various parameters concerning the optical switch according to the present invention, showing expected advantages.

DETAILED DESCRIPTION OF THE PREFERRED EMBODIMENTS

Now, the present invention will be described further by referring to the accompanying drawings that illustrate preferred embodiments of the present invention.

(1st Embodiment)

Figure 7:
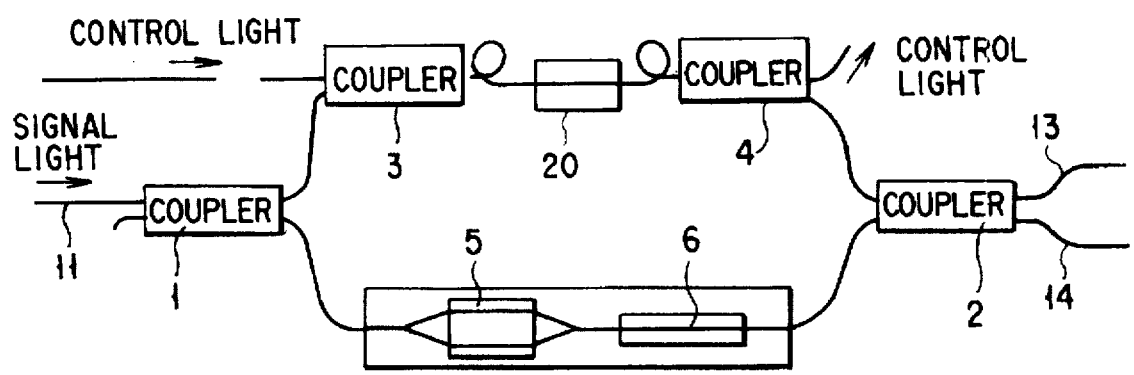
FIG. 7 is a schematic illustration of an optical control type optical switch realized by using a traveling wave type semiconductor laser amplifier in a first embodiment according to the present invention, showing its configuration.

FIG. 7 is a schematic illustration of a Mach-Zehnder interferometer type optical switch realized by using a traveling wave type semiconductor laser amplifier according to the first embodiment of the present invention, showing its configuration.

As shown, components arranged between a polarization conserving fiber type 1:1 input optical coupler 1 and a polarization conserving fiber type output optical coupler 2 constitutes a Mach-Zehnder interferometer. A first fiber type polarization coupler 3, a semiconductor optical waveguide device (traveling wave type semiconductor laser amplifier) 20 according to the present invention and a second fiber type polarization coupler (splitter) 4 are arranged on the first branch of the interferometer while an LiNbO$_3$ intensity modulator 5 and a phase modulator 6 are arranged on the second branch of the interferometer.

Signal light is pulse light having a linearly polarized wave with a wavelength of 1.3 μm and entered through an input terminal 11 of the input optical coupler 1 and made to go out through output terminals 13, 14 of the output optical coupler 2. Control light has a wavelength substantially equal to that of signal light and has a polarization orthogonal to that of the signal light. Control light is entered via the first polarization coupler 3 and made to go out via the second polarization coupler 4. The peak power of signal light is less than 1 mW, whereas that of control light is about 200 mW. Their pulse widths are respective 2 ps and 5 ps.

Figure 8:
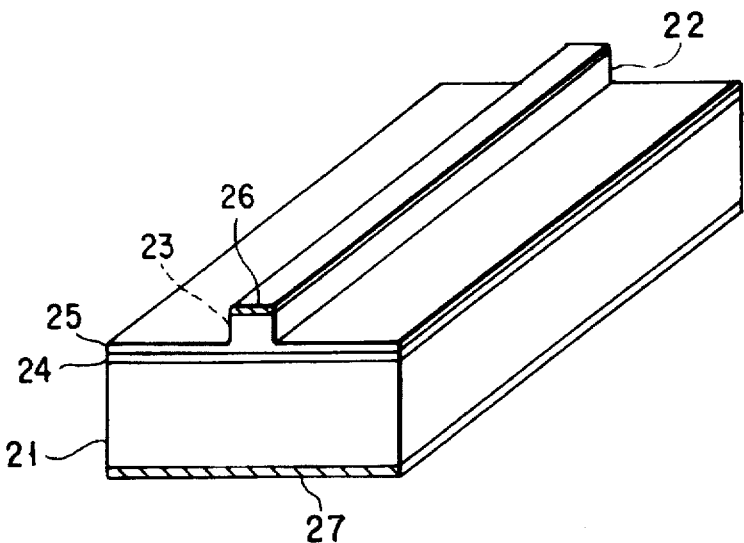
FIG. 8 is a schematic perspective view of a traveling wave type semiconductor laser amplifier according to a first embodiment or a wavelength conversion device according to a seventh embodiment of the present invention.

FIG. 8 schematically illustrates the traveling wave type semiconductor laser amplifier 20.

In FIG. 8, reference numeral 21 denotes a p-type CdTe substrate that also operates as a p-type clad layer. A semiconductor optical waveguide 22 is formed on the p-type CdTe substrate 21.

More specifically, the semiconductor optical waveguide 22 is formed by sequentially laying the p-type clad layer (p-type CdTe substrate) 21, an Hg$_{0.3}$Cd$_{0.7}$Te active waveguide layer 24, a mesa-shaped n-type CdTe clad layer 25 to produce a multilayer structure and the waveguide is defined by the stripe-shape of the n-type CdTe clad layer 25. An anti-reflection film 23 is arranged on each of the input and output facets of the semiconductor optical waveguide 22. An n-side electrode 26 is arranged on the mesa section of the n-type CdTe clad layer 25, whereas a p-side electrode 27 is arranged on the p-type CdTe substrate 21. The active waveguide layer 22 is biased by injecting an electric current through the electrodes 26 and 27 to show an active transparent state, where the loss and the gain are balanced.

The intensity modulator 5 regulates the intensity of the light introduced from the second branch so as to make it equal to that of the light introduced from the first branch. The phase modulator 6 regulates the phase of the second branch so as to make all signal output come out of the first output terminal 13 if there is not control light.

If a control light pulse is introduced in synchronism with the signal light pulse under this condition, the phase of the signal light is modified by the nonlinear optical effect of the Hg$_{0.3}$Cd$_{0.7}$Te active waveguide layer 24 that is biased to an active transparent state. This process of modification will be described below. If the intensity of the control light pulse is so regulated as to achieve a phase modification exactly equal to π at the output end, the signal output of the output optical coupler 2 is switched to the output terminal 14. This operation is carried out within 2 picoseconds as described earlier by referring to the prior art.

Figure 9:
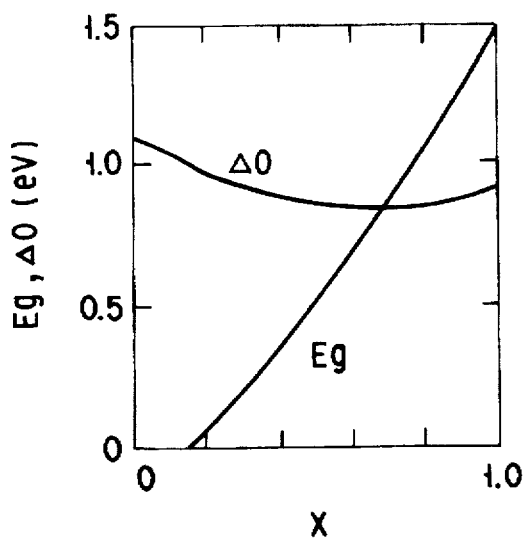
FIG. 9 is a graph showing the composition X dependency of the band gap Eg and the spin orbit split-off energy $\Delta_o$ of HgCdTe.

FIG. 9 is a graph showing the composition dependency of the band gap Eg and the spin orbit splitting $\Delta_o$ of Hg$_{1-x}$Cd$_x$Te. It will be seen that Eg≈$\Delta_o$ for Hg$_{0.3}$Cd$_{0.7}$Te (where x=0.7) with a resonant wavelength of about 1.3 μm. When guided light having this wavelength is introduced into the Hg$_{0.3}$Cd$_{0.7}$Te active waveguide layer 24, holes are excited to the spin orbit split-off band by inter-valence band resonant absorption. Note that the net inter-band transition is suppressed because the active waveguide layer is held to a transparent state.

In the above described system, the effective mass of each valence electron at or near the Γ point of the Brillouin zone is about 0.4 m$_o$ and there is only a small difference between any two effective masses (differently stated, the dispersion curve is parallel and joint-density-of-state is large) to show a large absorption coefficient. Consequently, hot holes are generated efficiently by strongly exciting light. As the energy distribution of holes changes, the refractive index also changes. Since the number of holes in the heavy and light holes bands decreases under this condition, the gain also decreases instantaneously.

Figure 10:
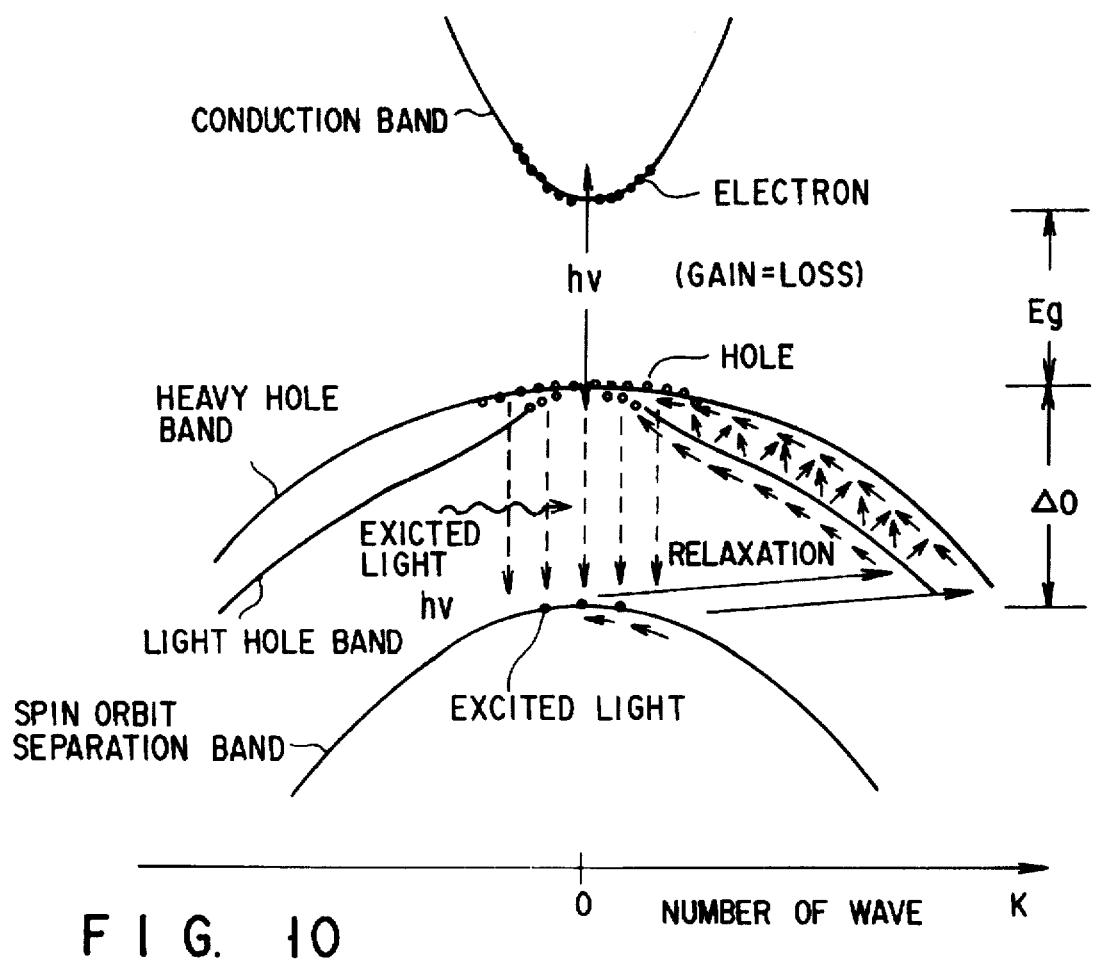
FIG. 10 is a schematic illustration of intervalence band absorption and its relaxation process of HgCdTe.

As shown in FIG. 10, excited hot holes lose their energy in a very short period of time as a result of inter-carrier collisions and collisions with phonons. The time required for intra-band relaxation of hot carriers is less than 0.1 picoseconds. Other carriers are also heated by the energy discharged as a result of relaxation. Then, any heated carriers also lose gradually the energy they have as they collide with phonons to restore the original state within 1 picosecond. In other words, as an exciting pulse is applied, there immediately occurs a large change in the refractive index but the refractive index and the transmission coefficient returns to the original values in about 1 picosecond after the removal of the exciting pulse.

Strictly speaking, the carrier density is also changed slightly as a result of incidental two-photon absorption. However, since the nonlinearity due to inter-valence band absorption is enhanced as a result of resonance, a switching operation can be carried out with a power level of exciting light that is by far lower than that of its counterpart of a conventional active transparent optical waveguide so that the influence of two-photon absorption that is proportional to the square of the power can be minimized. Additionally, since electrons and holes are already present at a high density in the active layer 22, the generation of carriers due to impact ionization caused by hot holes is suppressed. Thus, any undesirable changes in the performance of the device accompanied by an increased time constant that can be give rise to by excessively generated and accumulated carriers can also be suppressed even if the switching operation is repeated at an enhanced frequency of several hundred Gb/s.

As described above, with the first embodiment, since the nonlinearity due to intra-band absorption is enhanced by resonance, a switching operation can be carried out with a power level of exciting light that is by far lower than that of its counterpart of a conventional active transparent optical waveguide. Additionally, since the influence of two-photon absorption that excites carriers beyond the bandgap can be minimized, a high speed switching operation that is not restricted by the carrier lifetime can be realized.

(2nd Embodiment)

Figure 11:
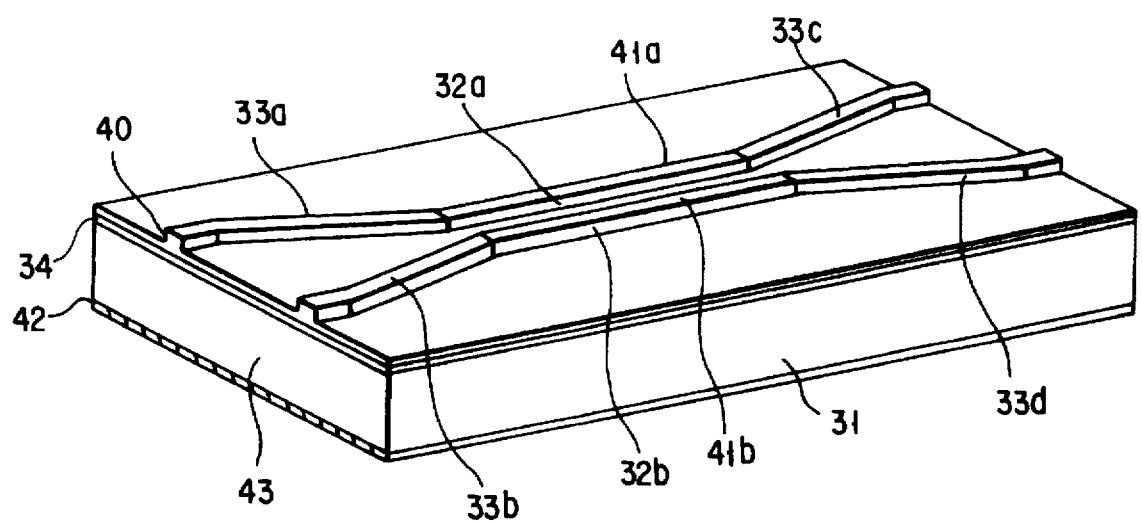
FIG. 11 is a schematic perspective view of an optical control type optical switch according to a second embodiment of the present invention.
Figure 12:
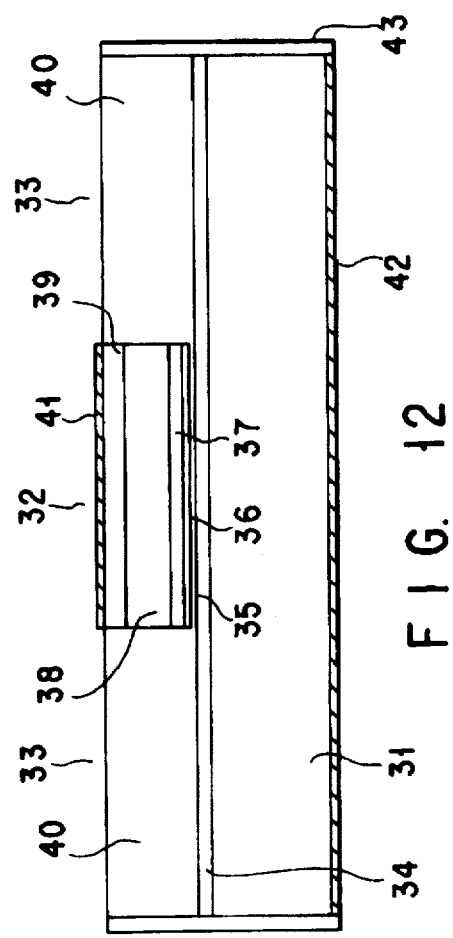
FIG. 12 is a schematic cross sectional view of the optical control type optical switch of FIG. 11, showing its optical waveguide section.

FIG. 11 is a schematic perspective view of an optical control type optical switch according to the second embodiment of the present invention, and FIG. 12 is a schematic cross sectional view of the optical control type optical switch of FIG. 11, showing its optical waveguide section.

The optical switch is formed on an n-InP substrate 31 and a directional coupler is formed at the center thereof by a pair of mesa-shaped active optical waveguides 32a, 32b. The active optical waveguides 32a, 32b are connected at the opposite ends thereof near the ends of the device to mesa-shaped passive optical waveguides 33a, 33b, 33c, 34d respectively. Each of the active optical waveguides 32a, 32b comprises an undoped InGaAsP passive waveguide layer 34, a thin undoped InP etch-stop layer 35, an InGaAs/strained AlAs quantum well layer 36, an InGaAsP waveguide layer 37, a p-type InP clad layer 38 and a p-type InGaAsP ohmic contact layer 39 laid sequentially in the cited order on the substrate 31 to form a multilayer structure. Under the passive optical waveguides 33a through 33d, the undoped InGaAsP passive waveguide layer 34 is sandwiched between the substrate 31 and a semi-insulated InP layer 40.

The active optical waveguides 32a, 32b carriers thereon respective ohmic electrodes 41a, 41b, while another ohmic electrode 42 is formed under the substrate 31. The electrodes 41a, 41b are connected to respective pads (not shown) on an insulation film and also to external circuits by bonding. The input and output facets of the optical switch is provided with an anti-reflection coat 43. The entire device is arranged on a Cu mount by way of the lower electrode 42, said Cu mount also operating as a heat sink and a ground.

Figure 13:
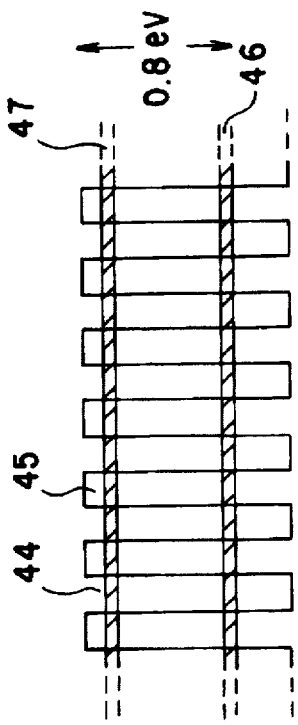
FIG. 13 is a schematic illustration of the conduction band of a principal portion of the active optical waveguide of the optical control type optical switch of FIG. 11, showing its structure.

FIG. 13 is a schematic illustration of the conduction band of a principal portion of the strained quantum well active layer 36 of either one of the active optical waveguides 32a, 32b. The quantum well layer 36 is realized by regularly arranging twenty five (25) unit structures, each comprising a thin InGaAs well layer 44 and a thin tensile strained AlAs barrier layer 45, in such a way that each InGaAs layer 44 is sandwiched between a pair of AlAs barrier layers 45, 45. A pair of subbands 46, 47 are arranged within each well layer. Since the barrier layer is thin, the subbands 46, 47 of each well are coupled by the tunneling effect to produce a miniband. Its inter-subband transition energy is about 0.8 eV (resonant wavelength of 1.55 µm) relative to TM mode light. The fact that such a large interval can be formed between a pair of subbands is described in J. H. Smet et al., Appl. Phys. Lett., vol.64, pp. 986–987, 1994.

The active optical waveguides 32a, 32b are so biased as to become transparent relative to TM mode light having a wavelength of 1.55 µm and have a small gain relative to TE mode light. Thus, electrons are injected into the first subband 46 by means of tunneling, whereas the second subband 47 is normally held vacant.

A weak signal light pulse having a wavelength of 1.55 µm is introduced to the active transparent optical waveguide 32a in the TE mode. If no exciting light pulse is present, the directional coupler is in a completely coupled state and the signal light pulse is transmitted to 33d. On the other hand, a strong exciting light pulse having a wavelength of 1.55 µm is introduced into the other active transparent optical waveguide 32b in the TM mode. If there is a strong exciting light pulse, the refractive index of the active transparent optical waveguides 32a, 32b is modified by the Kerr effect to switch the destination of signal light to 33c. Signal light can be separated from signal light typically by a polarization coupler.

The second embodiment operates substantially same as the first embodiment. If strong exciting wave having a wavelength of 1.55 µm is introduced into either one of the active transparent optical waveguides 32a, 32b, excitation takes place from the first subband 46 to the second subband 47 as a result of inter-subband resonant absorption, although net inter-band transition is suppressed. Since inter-subband transition is tolerative to light in the TM mode and the nonlinearity of inter-subband transition is generally large, there arises a large change in the refractive index (Kerr effect).

Electrons excited in the second subband 47 loses their energy in a short period of time as a result of inter-carrier collisions and collisions with phonons. The time required for relaxation for inter-subband and intra-band electrons is less than 0.1 picoseconds. Other carriers warmed by this relaxation gradually lose their energy as a result of collisions with phonons. If electrons are scattered to the L and X points in the process of relaxation, about 1 picosecond will have to be spent for them to return to the Γ point to make the recovery time slightly longer than that of the first embodiment, although they restore the original state in several picoseconds after the removal of the exciting pulse in any case. In short, the refractive index experiences a remarkable change instantaneously when an exciting light pulse is introduced but recovers its original level as soon as the exciting light pulse is gone.

With this second embodiment again, the influence of two-photon absorption is minimized to reduce the power required for exciting light. Additionally, since electrons and holes are already present at a high density in the active transparent optical waveguide layer 32, the generation of carriers due to impact ionization caused by hot electrons is suppressed. Thus, any undesirable changes in the performance of the device accompanied by an increased time constant that can be give rise to by excessively generated and accumulated carriers can also be suppressed even if the switching operation is repeated at an enhanced frequency of several hundred Gb/s.

As described above, with the second embodiment, a switching operation can be carried out with a power level of exciting light that is by far lower than that of its counterpart of a conventional active transparent optical waveguide.

It should be noted that the present invention is not limited to the above described embodiments and they may be modified or changed in a number of different ways. For example, they may be operated with a wavelength other than the one cited above by artificially changing the bandgap, the inter-valence band absorption energy and the inter-subband transition energy by means of a strained superlattice and/or a strained quantum well. The nonlinearity may be made to become more remarkable by appropriately modifying various parameters of the material of the active optical waveguide such as effective mass by means-of strain. Additionally, the material of the active optical waveguide and the overall configuration of the optical switch are not limited to those described above by referring to the above embodiments. For instance, the use of an intensity modulator and a phase modulator is not necessarily indispensable and an active transparent optical waveguide may be arranged in each of the branches of the Mach-Zehnder interferometer of the first embodiment. The optical switch, the optical coupler and other related devices may be monolithically formed on a semiconductor substrate.

(3rd Embodiment)

Figure 14:
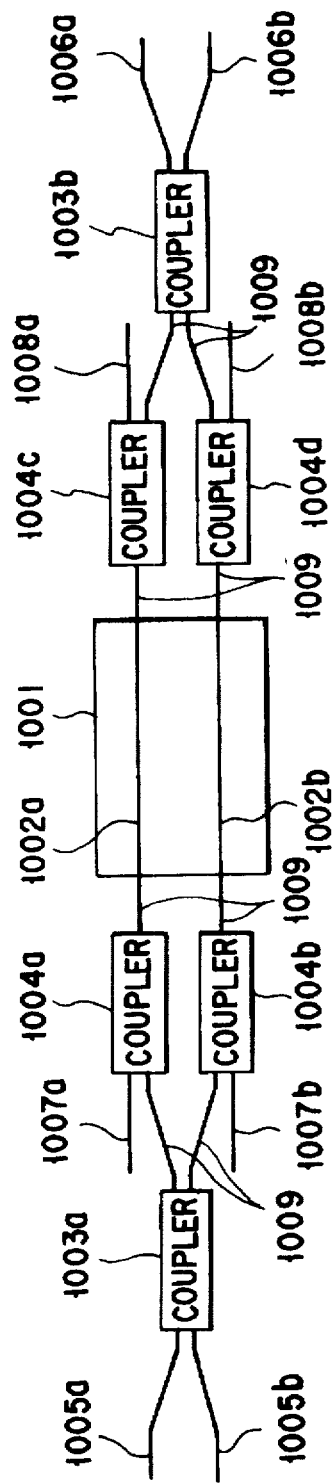
FIG. 14 is a schematic view of a Mach-Zehnder interferometer type optical switch according to a third embodiment of the present invention, showing its configuration.

FIG. 14 is a schematic view of a Mach-Zehnder interferometer type optical switch according to the third embodiment of the present invention.

The Mach-Zehnder interferometer comprises nonlinear waveguide sections 1002a, 1002b, 3 dB couplers 1003a, 1003b and polarization couplers 1004a through 1004d. The optical input/output ports of the interferometer include signal light input ports 1005a, 1005b, signal light output ports 1006a, 1006b, a control light input port 1007a, a control light output port 1008a and dummy input and output ports 1007b and 1008b for maintaining the symmetry of the interferometer. These ports are connected to the device by way of respective polarization maintaining fibers 1009.

The polarized waves of signal light and control light introduced into the respective polarization couplers 1004a and 1004b are so arranged that the signal light and the control light are transmitted through the respective nonlinear waveguide sections 1002a and 1002b in the TE mode and the TM mode respectively. The wavelengths of signal light and control light are both equal or close to 1.55 µm. Signal light introduced through the input port 1005a is divided into two branches by the 3 dB coupler 1003a to a ratio of 1:1, one of which is led to the 3 dB coupler 1003b by way of the polarization coupler 1004a, the nonlinear waveguide section 1002a and the polarization coupler 1004c while the other is also led to the 3 dB coupler 1003b by way of the polarization coupler 1004b, the nonlinear waveguide section 1002b and the polarization coupler 1004d. If no control light is present, the signal light experiences interference in the 3 dB coupler 1003b and sent out to the output port 1006b. On the other hand, control light is introduced through the control light input port 1007a and combined with the signal light in the polarization coupler 1004a to shift the phase of the signal light by π in the nonlinear waveguide section 1002a before it is separated from the signal light and fed to the control light output port 1008a. As the phase of signal light is shifted by π by control light in the nonlinear waveguide section 1002a, the signal light output is switched to the output port 1006a as a result of interference in the 3 dB coupler 1003b.

Figure 15:
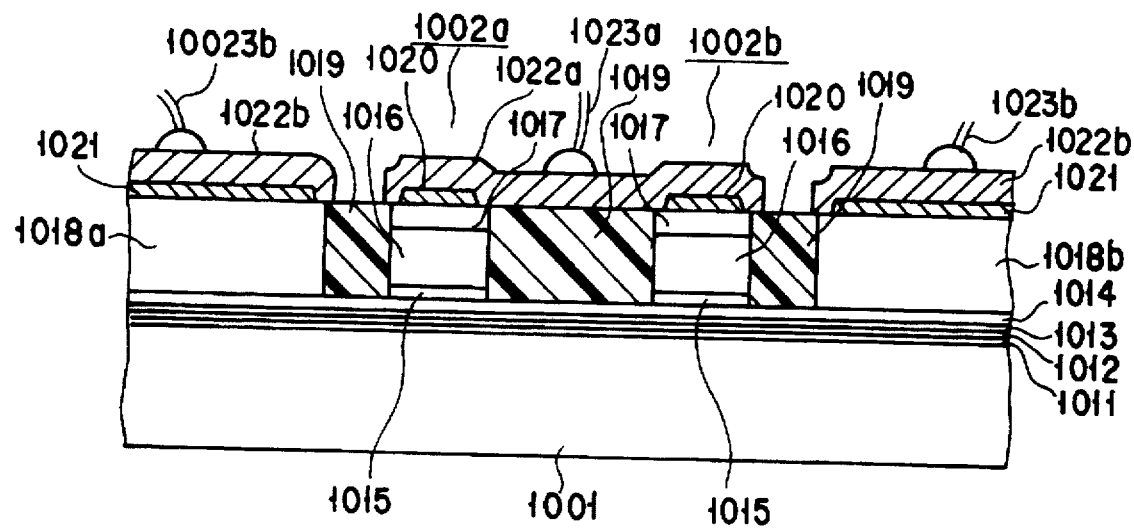
FIG. 15 is a schematic cross sectional view of the optical waveguide section of the Mach-Zehnder interferometer type optical switch of FIG. 14.

It may be understood from the above description that the configuration and the operation of this embodiment are basically same as those of any conventional Mach-Zehnder interferometer nonlinear optical switch, although the third embodiment is characterized by the arrangement of nonlinear waveguide sections 1002a, 1002b and their functions and effects. FIG. 15 is a schematic cross sectional view of the Mach-Zehnder interferometer type optical switch of FIG. 14 taken along a plane perpendicular to the waveguide.

Each of the nonlinear waveguide sections 1002a, 1002b comprises as principal components an InGaN/GaN/AlN multiple quantum well nonlinear waveguide layer 1012 formed on a (0001) sapphire substrate 1001 with an AlN buffer layer 1011 arranged therebetween, a thin upper AlGaInN buffer layer 1013, an n-type InGaAsP layer (with a PL wavelength of 1.15 µm) 1014 integrally formed on the buffer layer by direct bonding, a mesa-shaped undoped InGaAsP active waveguide layer (with a PL wavelength of 1.55 µm) 1015 formed thereon, a p-type InP clad layer 1016 and a p-type InGaAs contact layer 1017. The nonlinear waveguide layer 1012 and the buffer layer 1013 are arranged in so many layers with the c-axis agreeing with the normal. The layers from the n-type InGaAsP layer 1014 up to the p-type InGaAs contact layer 1017 are arranged in so many layers along the direction of <001>.

Light is guided mainly through the n-type InGaAsP layer 1014 and the active waveguide layer 1015, although it also permeates into nonlinear waveguide layer 1012 and the p-type clad layer 1016 to a large proportion to produce a unitary optical waveguide. The optical nonlinearity of the nonlinear waveguide section 1002 is mainly realized by the InGaN/GaN/AlN multiple quantum well nonlinear waveguide layer 1012 and the InGaAsP active waveguide layer 1015 operates mainly as gain producing means for compensating the produced waveguide loss.

On the n-type InGaAsP layer 1014, a pair of plateau-like InP contact layers 1018a, 1018b are formed outside of the two waveguide sections 1002a, 1002b with a distance of several µ m arranged therebetween for separating them. The gaps separating the optical waveguide sections 1002a, 1002b and the n-type contact layers 1018a, 1018b are mostly filled with polyimide 1019. A p-type ohmic electrode 1020 is formed on the p-type contact layer 1017, while an n-type ohmic electrode 1021 is formed on each of the n-type contact layers 1018a, 1018b. Metal pads 1022a, 1022b are formed on the ohmic electrodes 1020, 1021 and part of the polyimide layer and metal wires 1023a, 1023b are bonded thereto in order to establish electric connection with the outside.

An electric current fed from the outside flows sequentially through the wire 1023a, the pad 1022a, the p-type ohmic electrode 1020, the p-type contact layer 1017, the p-type clad layer 1016, the active waveguide layer 1015, the n-type InGaAsP layer 1014, the n-type contact layer 1018, the n-type ohmic electrode 1021, the pad 1022b and the wire 1023b. As the electric current is injected, a gain is produced in the active waveguide layer 1015 to compensate the loss produced in the nonlinear waveguide layer 1012, the p-type clad layer 1016 and some other layers.

Figure 16:
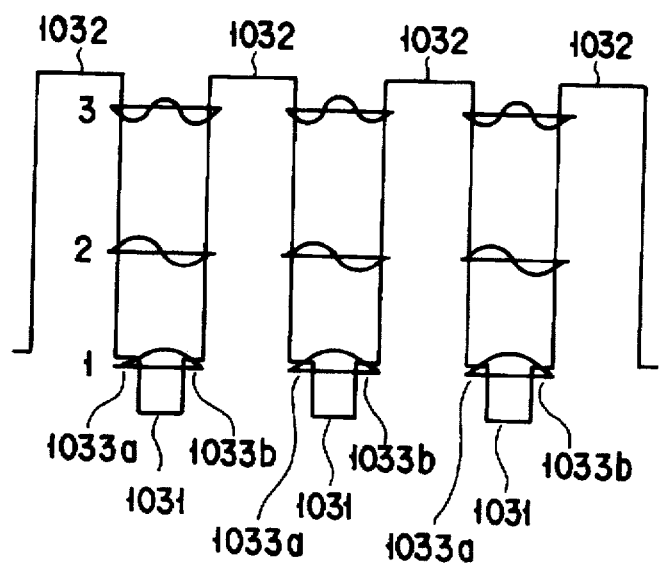
FIG. 16 is a schematic illustration of the conduction band of the nonlinear optical waveguide layer of FIG. 15, showing its structure.

FIG. 16 schematically illustrates the structure of the conduction band of the nonlinear waveguide layer 1012. The nonlinear waveguide layer 1012 has a multiple quantum well structure realized by arranging ten (10) quantum wells, each comprising an undoped $In_{0.25}Ga_{0.75}N$ well layer 1031 having a thickness of 1.06 nm, an undoped AlN barrier layer 1032 having a thickness of about 2 nm and a pair of n-type GaN intermediate layers 1033a, 1033b formed therebetween and having a thickness of 0.52 nm. Each quantum well has three subbands, of which the first one is held to an energy level lower than that of the bottom of the conduction band of the intermediate layer 1033, whereas the second and third subbands are held to an energy level higher than that of the bottom of the conduction band of the intermediate layer 1033. The resonant wavelength between the first and second subbands is about 1.554 µm and the resonant wavelength between the second and third subbands is about 1.21 µm. Almost all electrons fed from the n-type GaN intermediate layer 1033 are introduced into the first subband.

Since the first and second subbands of this embodiment show respective effective masses that are slightly different from each other, the wave number-energy dispersion curves of the two subbands eventually lose parallelism and the absorption spectrums tend to be slightly widened. However, the effect of such phenomena is not significant because electrons located near the Γ point really account for inter-subband transition. On the other hand, changes in the effective mass caused by inter-subband transition raise the degree of nonlinearity.

FIGS. 17A through 17F are schematic cross sectional views of the optical switch of the third embodiment in different manufacturing steps. A technique of direct bonding is used for the semiconductor substrate here.

Referring firstly to FIG. 17A, an AnN buffer layer 1011, an InGaN/GaN/AlN multiple quantum well nonlinear waveguide layer 1012 and an AlGaInN buffer layer 1013 are made to grow on a (0001) sapphire substrate 1001 by an MBE technique using a nitrogen plasma source.

Apart from the substrate, an n-type InGaAsP layer 1014, an InGaAsP active waveguide layer 1015, a p-type InP clad layer 1016, a p-type InGaAs contact layer 1017 are sequentially formed on a (001) InP substrate 1040 by epitaxial growth using an MOCVD technique.

Then, an insulation film 1041 is put to the epitaxial wafer, which is subsequently subjected to a patterning operation to etch out the contact layer 1017 and most of the p-type InP clad layer 1016 by means of a $CH_4$ RIE technique. Thereafter, the remaining p-type InP clad layer 1016 is etched by wet selective etching and then further wet-etched on a time-control basis to remove most of the InGaAsP active waveguide layer 1015. Consequently, a mesa region 1042 extending along the direction of <110> is formed as shown in FIG. 17C.

Again an MOCVD growth is carried out to bury the mesa region 1042 with an n-type InP layer 1018 until a substantially flat surface is produced there. After removing the insulation film, the epitaxial substrate is bonded to a glass substrate 1044 with an adhesive agent 1043 and the InP substrate 1040 is etched from the rear side, using a hydrochloric acid type selective etching solution. When the etching operation is stopped at the InGaAsP layer 1014, a structure as shown in FIG. 17D, where only the epitaxial layer is bonded to the glass substrate 1044, is left there. A flat surface of the n-type InGaAsP layer 1014 is exposed on the structure.

The surface of the n-type InGaAsP layer 1014 is mirror-polished to a surface coarseness of less than 50 nm and treated with acid, followed by washing with water and drying. Similarly, the surface of the flat AlGaInN buffer layer 1013 of the substrate, on which a nitride has been subjected to epitaxial growth as shown in FIG. 17A, is also mirror-polished to a surface coarseness of less than 250 nm and treated with acid, followed by washing with water and drying. Thereafter, the treated two surfaces of the substrates are directly bonded together by applying, if appropriate, pressure of several $kg/cm^2$ or without applying pressure. Since indium (In) is present on the both surfaces as a component element in a highly mobile state and phosphor (P) of the InGaAsP layer 1014 is also highly mobile through a vapor phase, the surfaces can be bonded together with relative ease. This bonding process is conducted in a clean room with a class 10 rating in order to prevent particles of dust from adhering the surfaces.

Figure 17E:
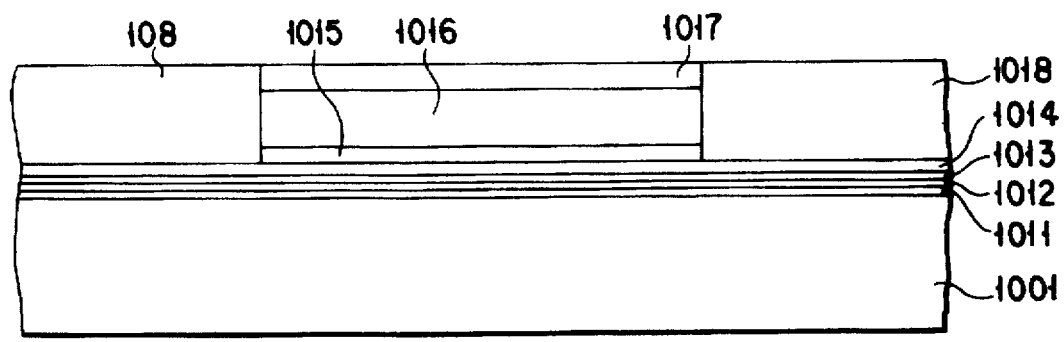

As the substrates are bonded together, the adhesive agent 1043 is removed and the glass substrate 1044 is separated therefrom before heating them at 250° to 500° C. in a hydrogen atmosphere. This heat-treatment may be conducted under appropriate pressure. As a result of the heat-treatment, the bonding strength is raised to provide a strongly bonded structure as shown in FIG. 17E. An oxide film may or may not be disposed on the bonded interface.

Figure 17F:
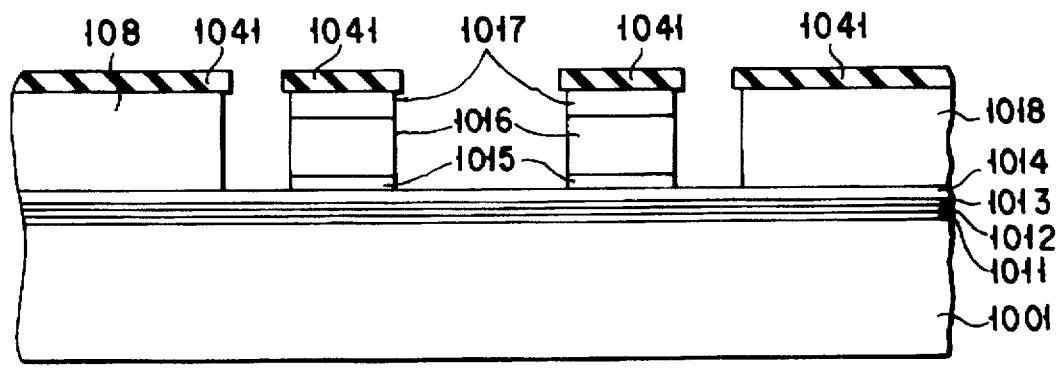

Thereafter, the bonded structure is again subjected to a series of operations of patterning, RIE mesa etching and wet etching to produce 2.5 μm wide mesas of the nonlinear waveguide section 1002 and the n-type contact layer 1018 as shown in FIG. 17F. A route is secured for electricity to run through by leaving the n-type InGaAsP layer 1014 there at this stage of operation.

Then, the surface is coated with polyimide, which is subsequently cured, and the mesas are made to become exposed. Thereafter, the ohmic electrodes and the metal pad are formed and the bonded substrates are cut to a given size to produce a finished nonlinear waveguide having a cross section as schematically shown in FIG. 15.

The sapphire substrate 1001 is mounted on a heat sink (not shown) whose temperature can be controlled. The input/output surfaces of the nonlinear waveguide sections 1002a, 1002b are coated with an anti-reflection film to realize a low loss optical coupling.

The figure of merit of an optical switch is normally expressed in terms of $|\chi^{(3)}|/(\alpha\tau)$. In other words, a high speed high efficiency optical switch that consumes energy at a reduced rate has an enhanced nonlinearity, a small absorption coefficient ($\alpha$) and a short response time ($\tau$). From experience, it is known that the value is somewhere around 100 esu·cm/s($\approx 1.4 \times 10^{-8} m^3/V^2$) at most (D. H. Auston et al., Appl. Opt., vol.26, pp.211–234, 1987). While it may be possible to achieve an exceptionally large figure of merit by low temperature anthracene surface excitation, the above value cannot be superseded by a remarkably higher value at room temperature. In short, no practically feasible high speed high efficiency nonlinear optical switch has been known to data.

The transition matrix element for interaction between light and substance is expressed by the approximate equation below.

$$\langle u_f f_f | H_I | u_i f_i \rangle = \langle u_f | H_I | u_i \rangle_{cell} \langle f_f | f_i \rangle + \langle u_f | u_i \rangle_{cell} \langle f_f | H_I | f_i \rangle \quad (2)$$

where $H_I$ is the interaction Hamiltonian, $|u_i\rangle$ and $|u_f\rangle$ are periodical portions of a Bloch function parallel to the well plane at the initial and final states respectively and $|f_i\rangle$ and $|f_f\rangle$ are envelop functions perpendicular to the well at the initial and final states respectively.

As different orthogonal base functions are applicable to the valence band and the conduction band for inter-band transition, $\langle u_f | u_i \rangle_{cell} = 0$ so that $\langle u_f f_f | H_I | u_i f_i \rangle = \langle u_f | H_I | u_i \rangle_{cell}$ is established for a combination of subbands of the conduction band and the valence band that provides $\langle f_f | f_i \rangle = 1 \neq 0$. $\langle u_f | H_I | u_i \rangle_{cell}$ is proportional to the extent of polarization produced by excitation within the unit cell and therefore to the lattice constant.

On the other hand, $\langle f_f | f_i \rangle = 0$ is true for inter-subband transition because the envelope functions are orthogonal each other, whereas $\langle u_f | u_i \rangle_{cell} \approx 1$ within the band because any Bloch functions are substantially identical there. Thus, $\langle u_f f_f | H_I | u_i f_i \rangle \approx \langle f_f | H_I | f_i \rangle$ is obtained for any light in the TM mode that provides $\langle f_f | H_I | f_i \rangle \propto = 0$. $\langle f_f | H_I | f_i \rangle$ is proportional to the extent of polarization within the well and hence to the width of the well. (See, inter alia, L. C. West and S. J. Englash, Appl. Phys. Lett., vol.46, p.1156, 1985.)

The total thickness of the well layer 1031 and the intermediate layers 1033a, 1033b is about 2.1 nm, which is more than three times greater than the lattice constant of any conventional InGaAsP type semiconductor. Since the nonlinear susceptibility factor $\chi^{(3)}$ is proportional to the fourth power of the transition matrix element, $\chi^{(3)}$ of the inter-band transition of this embodiment is greater than that of the inter-band transition of any conventional InGaAsP type substance by about a magnitude of two digits. On the other hand, since the absorption coefficient $\alpha$ is proportional to the square of the dipole moment, that of the present invention is increased by a magnitude of one digit as compared with the case of inter-band transition. This increase of absorption can be compensated by the gain of the InGaAsP active layer 1015 of the integrally formed waveguide.

As described earlier by referring to the second embodiment, while the response time of inter-band transition is restricted by the carrier lifetime, which is somewhere around 1 ns, the response time of inter-subband transition is restricted by intra-band relaxation time, which has a magnitude of 100 fs. Moreover, the time of intra-band relaxation of a substance having a remarkable ionicity and a large effective mass of electron such as GaN is expected to be much shorter than that of an InGaAsP type substance. Thus the response time of the embodiment is improved by a magnitude of three to four digits relative to a conventional optical switch that utilizes inter-band transition of an InGaAsP type substance.

As a result, the figure of merit, or $|\chi^{(3)}|/(\alpha\tau)$, of the nonlinear optical switch of the above described third embodiment that utilizes inter-subband transition is improved from that of a conventional nonlinear optical switch that utilizes inter-band transition by a magnitude of four to six digits and thus the embodiment can function as a practical high speed high efficiency nonlinear optical switch that operates at room temperature. Note that, while the optical switch of the third embodiment is designed to operate with a wavelength of 1.55 µm, an optical switch according to the present invention and designed to operate with a longer wavelength may show a further improvement in terms of greater nonlinearity because a thicker well layer is used there.

By comparing the above embodiment with a conventional optical switch comprising a transparent active waveguide, it will be seen that the improvement in $\alpha\tau$ is small but the value of $|\chi^{(3)}|$ can be increased by a magnitude of two digits so that the optical input energy required for switching operation can be significantly reduced. Additionally, the number of carriers within the well is maintained to a constant level because the component semiconductor layers of the nonlinear waveguide layer 1012 have a wide band gap and therefore it does not give rise to multiple photon absorption relative to light having a wavelength of 1.55 µm nor induce injection of carriers from other layers. Still additionally, since the optical input can be held to a low level, it does not significantly affect the optical nonlinearity of the layers other than the nonlinear waveguide layer 1012 nor does it give rise to any fluctuations in the number of carriers due to two-photon absorption. Thus, consequently, fluctuations in the gain that take place slowly for several nanoseconds as well as fluctuations in the optical nonlinearity can be effectively suppressed. As a combined effect of the advantages pointed out above, the embodiment can operate stably even if a quick pulse is applied repetitively.

The above described third embodiment can also be modified in a number of ways as the resonant wavelength of intra-band transition and the gain wavelength of the active waveguide layer resonate. Additionally, the lattice constant and the crystal type may be combined in a number of different ways through the use of direct bonding. For instance, a wide band gap semiconductor substance such as an SiCGe type material, II–VI group semiconductor or a chalcopyrite material may be used in place of an InGaAlN type substance for the inter-subband transition layer. If the influence of two-photon absorption is not a problem, a quantum well of narrow band gap semiconductor substance such as an AlGaInAsSb type material may be used for the inter-subband transition layer. As in the case of the second embodiment, inter-valence band transition between the HeCdTe type spin orbit split-off band and the heavy and light hole bands may be utilized. As described earlier by referring to the second embodiment, the response time of inter-valence band transition is very short because it is restricted by the intra-band relaxation time. Still additionally, any appropriate semiconductor material may be used for the active waveguide. Finally, an optical coupler and a polarization coupler may be formed on Si substrate and bonded to a nonlinear waveguide by direct bonding to produce an integrated device. The type of substrate, the wavelength, the manufacturing method, the electric current injection arrangement, the optical waveguide structure and the well structure are not limited to those described above for the third embodiment.

(4th Embodiment)

FIG. 18 is a schematic illustration of an optical control type optical switch according to the fourth embodiment of the present invention. The optical control type optical switch of this embodiment is monolithically formed on an n-type InP substrate 101.

The optical switch comprises a first optical coupler 111, a second optical coupler 112, a third optical coupler 113, a fourth optical coupler, a fifth optical coupler that operates as signal light branching means and a sixth optical coupler that operates as a signal light sending out coupler, all of which are 1:1 directional couplers (3 dB couplers).

Input optical signal is introduced into either one of the input ports of the fifth optical coupler 115 via an input waveguide 135. The fifth optical coupler 115 branches the input signal light to a first intermediate optical waveguide (first intermediate light path) 131 and a second intermediate optical waveguide (second intermediate light path) 132 to a ratio of 1:1.

The first intermediate optical waveguide 131 and a first control light input optical waveguide 141 are coupled to a first optical waveguide 121 and a second optical waveguide 122, which is structurally symmetrical relative to the first optical waveguide 121. The first and second optical waveguides 121 and 122 intersects each other at a middle point and are then coupled to a first control light output waveguide (first control light output light path) 143 and a third intermediate optical waveguide (third intermediate light path) 133 by the second optical coupler 112. The stretch from the first optical coupler 111 to the second optical coupler 112 constitutes a first Mach-Zehnder interferometer 151.

Likewise, the second intermediate optical waveguide 132 and the second control light input optical waveguide 142 are coupled to a third optical waveguide 123, which is structurally identical with the first optical waveguide 121, and a fourth optical waveguide 124, which is structurally identical with the second optical waveguide 122. The third and fourth optical waveguides 123 and 124 are coupled to a second control light output waveguide (second control light output light path) 144 and a fourth intermediate optical waveguide (reference light path) 134. The stretch from the third optical coupler 113 to the fourth optical coupler 114 constitutes a second Mach-Zehnder interferometer 152, which has a configuration identical with that of the first Mach-Zehnder interferometer.

The third intermediate optical waveguide 133 and the fourth intermediate optical waveguide 134 are coupled to a first output optical waveguide (first signal light output light path) 136 and a second output optical waveguide (second signal light output light path) 137 by the sixth optical coupler 116. The stretch from the fifth optical coupler 115 to the sixth optical coupler 116 constitutes a third Mach-Zehnder interferometer, which includes the first Mach-Zehnder interferometer 151 and the second Mach-Zehnder interferometer 152 disposed at the respective branching points.

The first through fourth optical waveguides 121, 122, 123, 124 respectively comprise active waveguide sections 161, 162, 163, 164, each having a total length of 10 mm, and phase modulation sections 171, 172, 173, 174, each having a length of 500 µm.

Figure 19A:
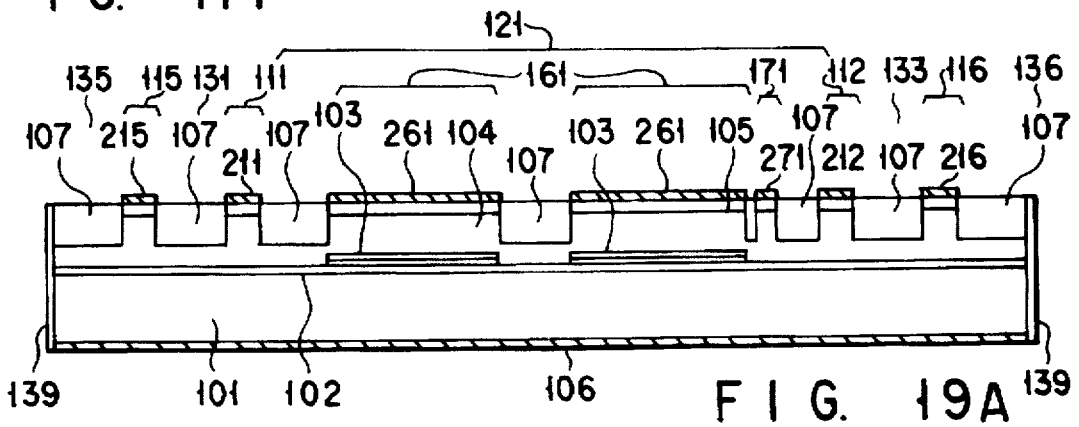
FIGS. 19A and 19B are schematic cross sectional views of the optical control type optical switch of FIG. 18 taken along the direction of waveguide and the direction perpendicular to that of waveguide respectively.

FIG. 19A is a schematic cross sectional view of the above embodiment taking along the optical path from the input waveguide 135 all the way to the first output waveguide 136 via the fifth optical coupler 115, the first intermediate optical waveguide 131, the first optical coupler 111, the first optical waveguide 121, the second optical coupler 112, the third intermediate optical waveguide 133 and the sixth optical coupler 116. Note that the optical coupling with the adjacent channel in the optical couplers is neglected in FIG. 19A. Also note that a portion of the first optical waveguide 121 forms an active waveguide section 161, while another portion of the optical waveguide 121 forms a phase modulator 171. Because of the structural symmetry, signal light passing through the other branching points is made to pass optical waveguides having an identical cross sectional view. The input and output facets of each of the optical waveguides 135, 136, 137, 141, 142, 143 and 144 are coated with anti-reflection film 139 and connected to the outside by optical fiber.

The waveguide layer of the embodiment basically comprises an n-type InP substrate 101 that also operates as a clad layer, a common passive waveguide layer 102 made of undoped InGaAsP and designed for a PL wavelength of 1.2 μm, an active waveguide layer 103 formed only in the active waveguide section 161 of the first waveguide 121 and designed for a PL wavelength of 1.55 μm, a p-type InP clad layer 104 and a p-type InGaAsP ohmic contact layer 105. A common electrode 106 is arranged under the substrate. Electrodes 215, 211, 212, 216 are respectively formed on the contact layers of the optical couplers 115, 111, 112, 116 for finely regulating the branching ratio to 1:1 by applying a reverse bias voltage.

An electric current injection electrode 261 is formed on the contact layer of the active waveguide section 161 to bias the active waveguide in order to produce a transparent state. A reverse bias electrode 271 is formed on the contact layer of the phase modulation section 171 to regulate the phase of the Mach-Zehnder interferometers. All the contact layer 105 and most of the p-type InP clad layer 104 are removed from the optical waveguide except where the electrodes are formed and then a semi-insulated InP layer 107 is formed there to fill the vacancy to electrically isolate the upper electrodes.

Figure 19B:
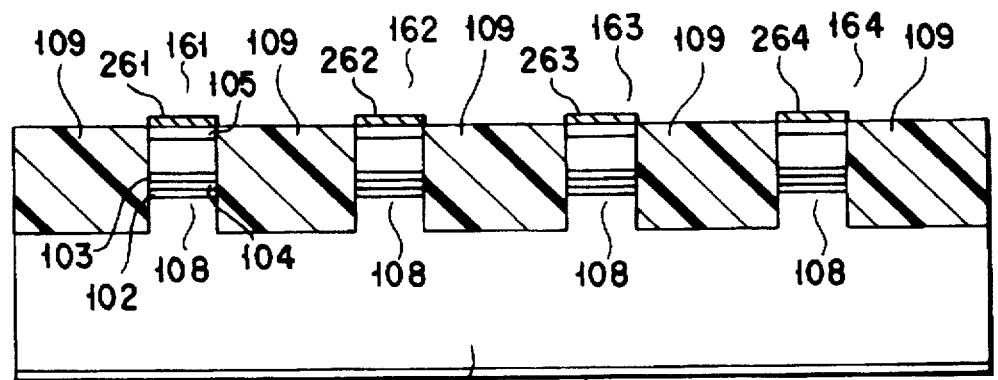

FIG. 19B is a schematic cross sectional view of the above embodiment taken along a plane perpendicular to the direction of waveguide of the active waveguide sections 161, 162, 163, 164. Each of the optical waveguides shows a mesa 108 having a width of 2 μm and the gap between two adjacent mesas is filed with polyimide 109 to produce a flat surface. Although not shown, each of the upper electrodes is connected to a pad, which is then connected to an external circuit by a bonding wire, whereas the lower electrode is rigidly secured to a Cu block by AuSn solder, said Cu block operating also as a heat sink and a ground.

The above optical control type optical switch operates in a manner as described below. Assume here that signal light is a pulse having a data rate of 100 Gb/s and a pulse width of 1 ps and optically demultiplexed by a trapezoidal pulse of control light having a frequency of 25 GHz and a pulse width of 5 ps. The peak power of control light is so regulated that it shifts the phase of signal light by π in the first and second optical waveguides 121, 122. As shown in FIG. 20, the two pulses are so regulated that the plateau of each trapezoid of control light covers a peak of signal light. The optical switch can respond to a pulse having such a high frequency because it comprises active transparent waveguides.

Assume here also that the first through fourth active optical waveguide sections 161, 162, 163, 164 are biased to provide transparency with regard to the wavelength of optical input and that the optical couplers 111, 112, 113, 114, 115, 116 are so regulated by a reverse bias voltage applied thereto as to provide a branching ratio of 1:1 and the Mach-Zehnder interferometers 151, 152, 153 are compensated for phase by the phase modulators 171, 172, 173, 174 to establish perfectly symmetry. Note that, the phase of light crossing channels at any of the 1:1 optical couplers 111, 112, 113, 114, 115, 116 is shifted by π/2 relative to that of light traveling through the channel.

If there is no control light, the signal light pulse is introduced into the input waveguide 135 from an optical fiber and branched by the fifth optical coupler 115 to the first intermediate waveguide 131 leading to the first Mach-Zehnder interferometer 151 and the second intermediate waveguide 132 leading to the second Mach-Zehnder interferometer 152 to a ratio of 1:1. The component of light branched to the first intermediate waveguide 131 is further branched by the first optical coupler 111 to the first optical waveguide 121 and the second optical waveguide 122 to a ratio of 1:1. Since there is no control light and the signal light is weak, no phase shift is produced to the signal light in the active waveguide sections 161, 162 by the nonlinear optical effect. Thus, the phase difference between the light coming from the first optical waveguide 121 and the one coming from the second optical waveguide 122 at the input section of the second optical coupler 112 is equal to π/2.

As a result of it, all the signal light output of the first Mach-Zehnder interferometer 151 is coupled to the third intermediate waveguide 133 to make the output to the first control light output waveguide 143 equal to nil. Similarly, all the signal light output of the second Mach-Zehnder interferometer 152 is coupled to the fourth intermediate waveguide 134 by the fourth optical coupler 114. The phase difference between the two components of signal light introduced into the sixth optical coupler 116 is still π/2, which is defined by the fifth optical coupler 115. So, consequently, all the components of signal light is given to the first output optical waveguide 136.

Assume now that control light is introduced into the first Mach-Zehnder interferometer 151 from the first control light input waveguide 141 by the first. optical coupler 111. Then, the control light shifts the phase of signal light by π in the first and second optical waveguides 121, 122. Since the first Mach-Zehnder interferometer 151 does not change the destination of signal light for identical phase shifts in the two branches, all the components of signal light there is introduced into the third intermediate waveguide 133 although there is control light, while all the control light is given to the first control light output waveguide 143. However, only the phase of the component of signal light passing through the branch including the first Mach-Zehnder interferometer 151 is shifted by π in the third Mach-Zehnder interferometer 153 and, therefore, the destination of signal light is switched to the second signal light output waveguide 137.

As described above, the fourth embodiment can perfectly switch the signal light output having a data rate as high as 100Gb/s from 0:1 to 1:0 and separate the control light and the signal light.

The present invention is not limited to the above embodiment. For instance, if the first and second optical couplers are so arranged that the length of either one is made equal to a ½ of the perfect coupling length while that of the other one is made equal to ⅔ of the perfect coupling length, the phase shift of the light crossing the former will be π/2 and that of the light crossing the latter will be −π/2 so that the crossing 125 will become unnecessary. Alternatively, the crossing 125 may be eliminated by biasing either the first optical waveguide 121 or the second optical waveguide 122 such that they produce a phase difference of π.

The above described functional features may be obtained by combining fiber type optical couplers and optical fiber, although the requirements of stability and downsizing may not necessarily be met.

The present invention may find a number of different applications. For example, control light may be reused with an optical switch according to the present invention. If three optical switches 180a, 180b, 180c of the first embodiment are arranged for cascade connection as shown in FIG. 21 so that control light and signal light are introduced to each optical switch with a timing shifted sequentially by 10 picoseconds by means of delay optical waveguide 181a, 181b, an optical demultiplexing from 100 Gb/s to 25 Gb/sx4 can be achieved. All the components may be monolithically and integrally formed with a control pulse light source 182 and signal receiving high speed waveguide type photodiodes 183a, 183b, 183c, 183d.

If an optical coupler is used for input signal branching means, a two-input arrangement may be realized for signal light. If such is the case, the outputs of two different signal lights may be switched between cross and bar states. With such an arrangement, an optically controlled ultrahigh speed optical switching operation can be realized and applied to a self-routing switch for an optical ATM switch.

In an optical switch having a second Mach-Zehnder interferometer may be used for optical logic operations by using a first control light introduced from a first control light input waveguide and a second control light introduced from a second control light input waveguide. If the phase of the output signal light of the second Mach-Zehnder interferometer is shifted by $\phi$ by the second control light, the output optical coupler of the third Mach-Zehnder interferometer will produce a phase difference of $\phi$—$\phi$. Thus, signal outputs corresponding to exclusive OR and its negation for two control lights can be obtained at the output of the third Mach-Zehnder interferometer by utilizing this phenomenon. The second control light may be used for phase biasing by using continuous light for it.

While the present invention is described above exclusively in terms of digital routing switching operations, the ratio of two outputs may be modified to any given ratio by continuously regulating the input control light. Therefore, the present invention may be applied to an ultrahigh speed optical control type optical modulator. FIG. 22 is a graph showing the relationship between the input optical power and the output when the optical switch of the fourth embodiment is used for an analog optical modulator. It will be seen that complicated modulating operations can be carried out for signal light by using two input control lights.

It will also be seen that the present invention has a number of different applications.

As described above in detail by referring to the first through fourth embodiments, the nonlinearity attributable to intra-band absorption can be made greater than the nonlinearity attributable to two-photon absorption by using a material that makes the resonant wavelength of intra-band absorption substantially equal to the wavelength of incident light for at least part of the layered structure of optical waveguide. Consequently, a device according to the present invention can realize a high frequency switching operation with a low consumption rate of excitation energy more efficiently than any comparable conventional devices. Additionally, a device according to the present invention can perfectly switch the destination of output signal light with a large extinction ratio so that a high speed high efficiency optical control type optical switch can be realized.

For reference, expected advantages of the optical switch according to the present invention is shown in terms of various parameters in FIG. 33.

(5th Embodiment)

FIG. 23 is a partially cut-away schematic perspective view of a wavelength conversion device according to the fifth embodiment of the present invention.

In the wavelength conversion device, four wave mixing of a traveling wave type semiconductor laser amplifier is used for wavelength conversion. Referring to FIG. 23, a stripe-shaped semiconductor optical waveguide 302 is formed on an n-type InP substrate 301 that also operates as a n-type clad layer. The semiconductor optical waveguide 302 is realized by sequentially arranging an n-type clad layer (n-type InP substrate 301), an undoped InGaAsP optical waveguide layer 303, a strained quantum well active layer 304 comprising an undoped strained InGaAs/strained AlAs quantum well, an InGaAsP optical waveguide layer 305 and a p-type InP clad layer 306 in the above order to form a multilayer structure. A p-type InGaAsP ohmic contact layer 307 is formed on the p-type InP clad layer 306.

A buried layer comprising a p-type InP layer 308 and an n-type InP layer 309 is formed along the lateral sides of the semiconductor optical waveguide 302 in order to confine an electric current to the semiconductor optical waveguide 302. A p-side ohmic electrode 311 and an n-side ohmic electrode 312 are arranged respectively on the p-type InGaAsP ohmic contact layer 307 and under the InP substrate 301. The input and output facets are coated with an anti-reflection film 313 to suppress the reflectivity of the facets to less than 0.1%.

The wavelength conversion device is arranged on a Cu mount (not shown) provided with an Au coated AlN submount that also operates as a heat sink and connected to feed lines by bonding.

Figure 1A:
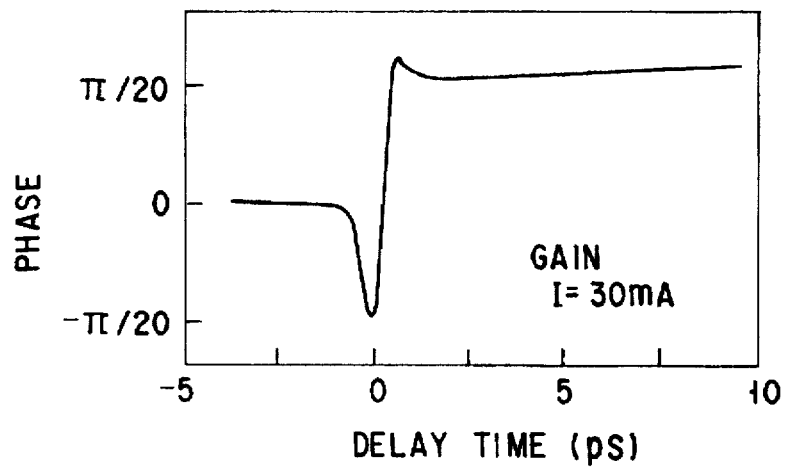
FIGS. 1A through 1C are graphs showing the change with time of the phase of a transmitted probe light pulse after the transmission of exciting light pulse.
Figure 1B:
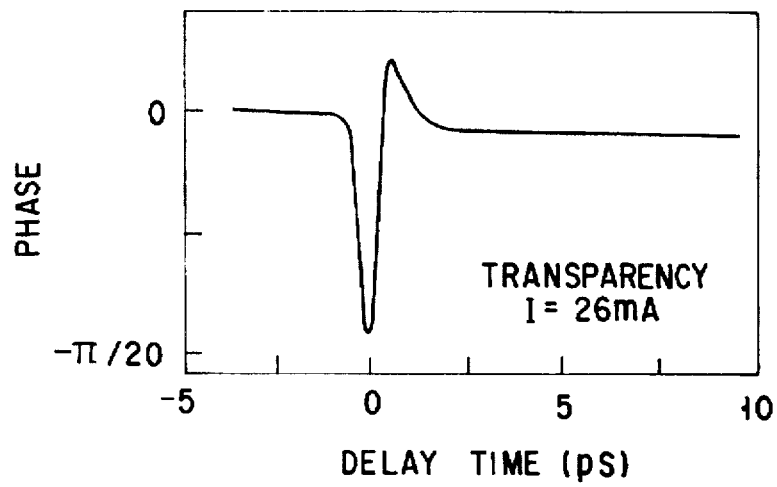
Figure 1C:
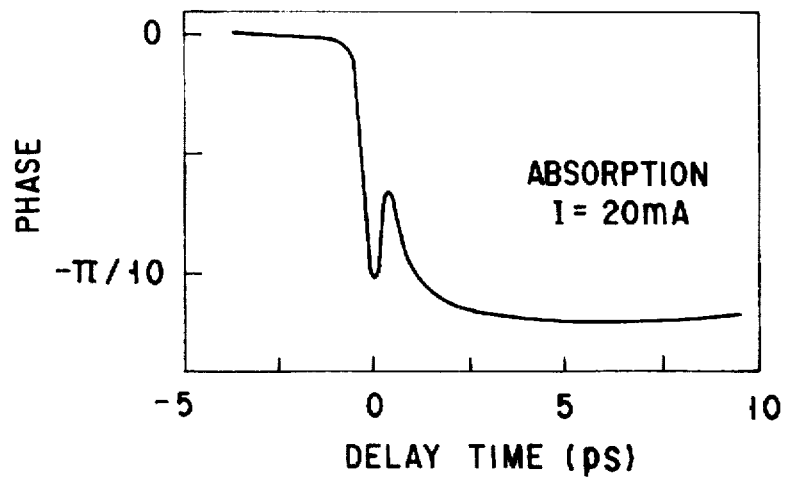
Figure 5:
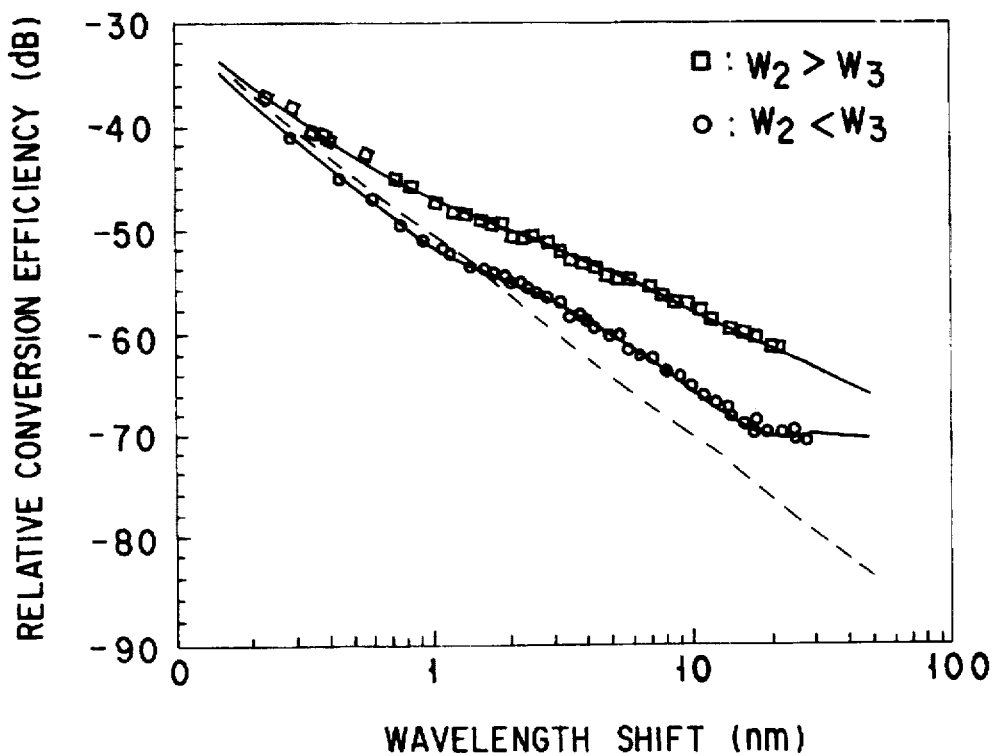
FIG. 5 is a graph showing the $\Omega$ dependency of the wavelength conversion efficiency $\eta$ of a tensile strained InGaAs/InGaAsP (MQW) conventional traveling wave type semiconductor laser amplifier.
Figure 6:
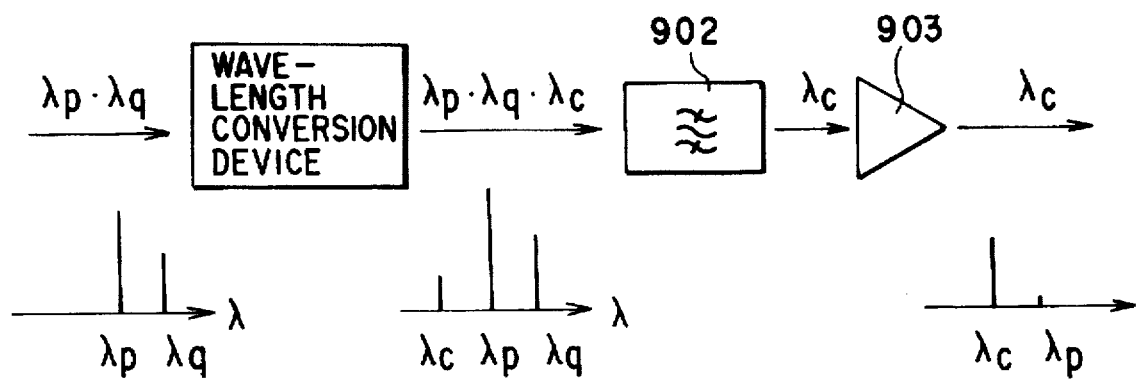
FIG. 6 is a schematic illustration of wavelength conversion nodes using conventional traveling wave type semiconductor laser amplifiers and a tunable wavelength filter.

The wavelength conversion device is typically assembled with input/output optical fibers, a pair of aspherical lenses for realizing a low loss optical coupling with the input/output optical fibers, an optical isolator and a Peltier cooler to produce a module. As shown in FIG. 6, this module may be combined with an optical multiplexer/demultiplexer, a narrow band optical filter and an optical amplifier to carry out wavelength conversion of light that operates as a signal carrier wave.

In the fifth embodiment, the strained quantum well active layer operates as a semiconductor layer having a resonant wavelength of intra-band absorption defined within the gain band of a traveling wave type semiconductor laser amplifier. FIG. 24 shows a schematic illustration of the structure of the conduction band of a principal portion of the strained quantum well active layer 304 of the semiconductor optical waveguide 302.

The strained quantum well active layer 304 is realized by arranging twenty (20) unit layers, each comprising a thin InGaAs well layer 314 and a thin tensile strained AlAs barrier layer 315, the InGaAs well layer being sandwiched between a pair of barrier layers. There exists a first subband 316 and a second subband 317 in the InGaAs well layer 314.

The transition from the first subband 316 to the second subband 317 is an allowed transition based on the parity rule. Since the tensile strained AlAs barrier layer 315 is thin, the subbands 316 and 317 of each InGaAs well layer 314 are coupled by tunneling to form minibands. The inter-subband transition energy is about 0.8 eV (a resonant wavelength of 1.55 μm).

That such a large gap can be formed between subbands is described in J. H. Smet et al., Appl. Phys. Lett., vol.64, pp.986–987, 1994.

An electric current is injected into the strained quantum well active layer 304 in such a way that it may give rise to a sufficient gain to light having a wavelength of or close to 1.55 μm. Thus, electrons are injected at a high density into the first subband 316 by way of the tunneling, whereas holes are injected into the valence band.

Because of the population inversion of electrons and holes, a stimulated emission gain is produced in the strained quantum well active layer 304 so that light having a wavelength of or close to 1.55 π m and introduced into the semiconductor optical waveguide 302 is amplified.

If pump light having an angular frequency of $\omega_1$ and signal light having an angular frequency of $\omega_2=\omega_1-\Omega$ are introduced simultaneously, the gain and the refractive index are modulated by a beat frequency of $\Omega$ and a light with an angular frequency of $\omega_3=\omega_1+\Omega$ is generated as in the case of a conventional traveling wave type semiconductor laser amplifier so that only the component with the angular frequency $\omega_3$ can be taken out by means of an external narrow band optical filter as in the case of a conventional wavelength conversion device.

Figure 25:
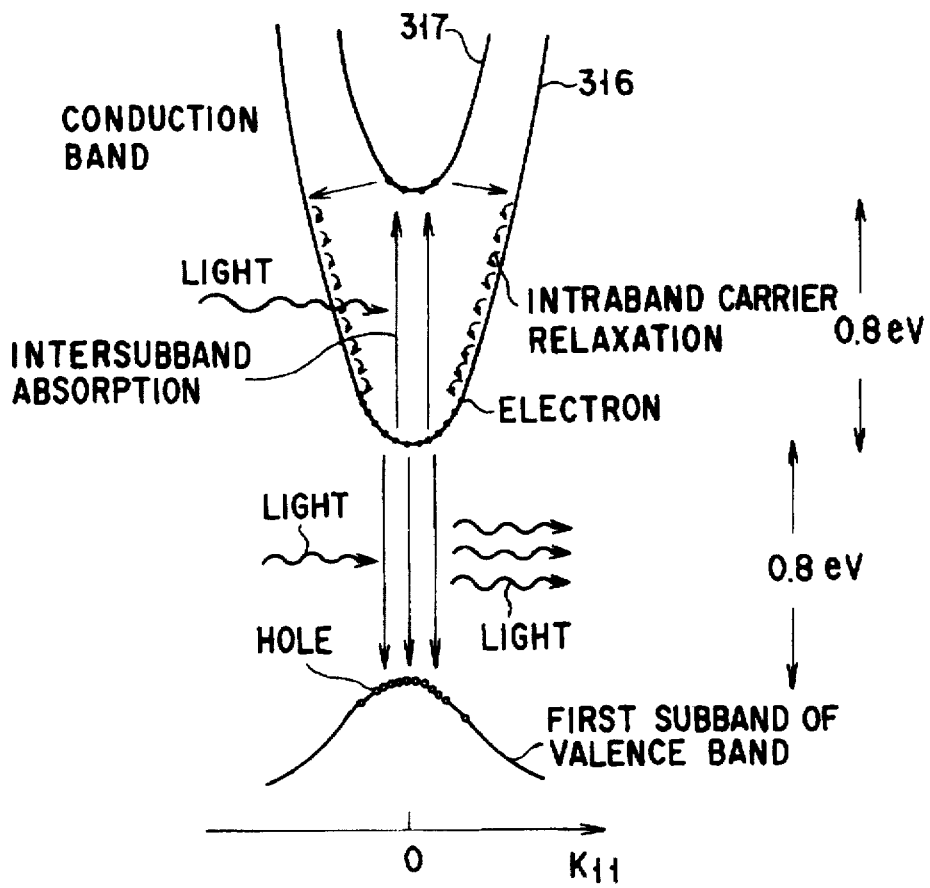
FIG. 25 is a schematic illustration showing how the state of carriers of the wavelength conversion device of FIG. 23 changes.

Since the absorption resonant wavelength between the first and second subbands 316 and 317 of the conduction band locates in the gain wavelength, electrons in the first subband absorb part of the light in the semiconductor optical waveguide and excited to the second subband 317, as shown in FIG. 25.

The electrons excited to the second subband relax to the high energy level of the first subband in a short period of time as they collide with phonons. Then, the electrons at the high energy level relax to the original low energy level as they collide with electrons and phonons (intra-band carrier relaxation).

The process of intra-band carrier relaxation is basically identical with the relaxation process of spectral hole burning and that of carrier heating and has a time constant as short as hundreds of several femtoseconds to several picoseconds.

It will be appreciated that such a remarkable extent of nonlinearity cannot be achieved by any conventional wavelength conversion device, where only nonlinear effects such that free carrier absorption and two-photon absorption modulate the intra-band carrier energy distribution except spectral hole burning due to the stimulated emission.

With the intra-band resonant absorption of the above described fifth embodiment, to the contrary, the refractive index and the gain are modulated to a large extent, since the electron energy distribution is remarkably changed by the optical field variation with a beat frequency $\Omega$.

By adding the effect of four wave mixing of intra-band absorption (complex coupling efficiency $C_4$, time constant $\tau_4$) to formula (2), the conversion efficiency can be expressed by the equation below.

$$\eta = 10 \log_{10}(P3(1)/P2(0)) \quad (3)$$
$$= 3G + 2I_p + 20 \log_{10}\left|\sum_{m=1}^{4} C_m/(1-i\Omega\tau_m)\right|$$

As described above, the relaxation process is a complex process involving several different time constants and, therefore, needs to be expressed by adding a fifth effect ($C_5$, $\tau_5$) and further subordinate effects to the above formula to make it more accurate.

However, if the active layer itself is the inter-subband resonant absorption layer as in the case of the fifth embodiment, such additional effects may be regarded not as new effects attributable to inter-subband transition but as revised values of $C_2$ and $C_3$ increased as a result of intra-band resonant absorption.

For the purpose of simplification, the component having a time constant raised to the level of that of carrier heating as a result of intra-band resonant absorption is expressed by $C_4$, $\tau_4$ hereinafter.

Figure 26:
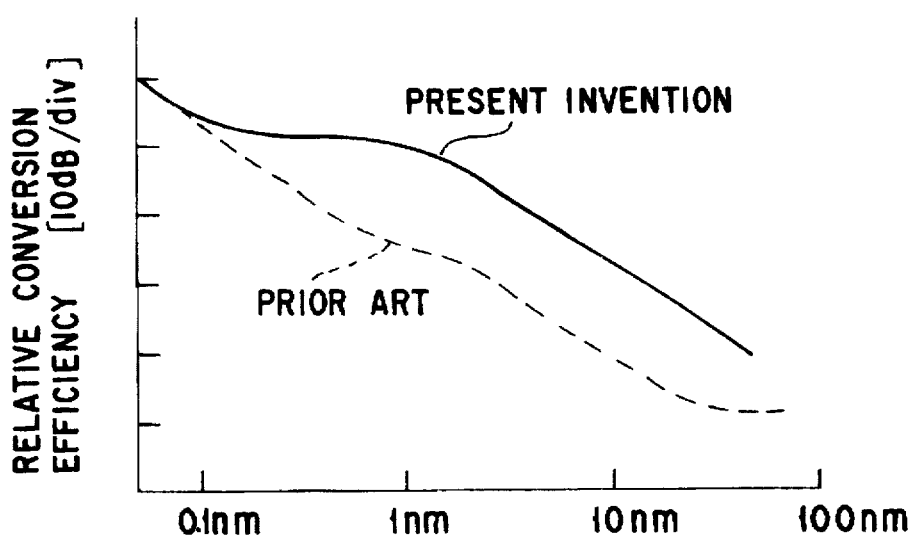
FIG. 26 is a graph showing the relative wavelength conversion efficiency of the wavelength conversion device of FIG. 23 in comparison with that of a conventional wavelength conversion device.

FIG. 26 is a graph showing the relative wavelength conversion efficiency (solid line) of the wavelength conversion device of the fifth embodiment in comparison with that (broken line) of a conventional device.

It is seen from FIG. 26 that a high relative wavelength conversion efficiency can be achieved with a device according to the present invention even when the wavelength difference exceeds 1 nm. In other words, a device according to the present invention can realize highly efficient wavelength conversion over a bandwidth broader than ever. This is because the present invention can provide a large absolute value for the complex coupling efficiency $C_4$ and a value substantially equal to that of $\tau_2$ for the time constant $\tau_4$. Therefore, a device according to the present invention can respond to a signal that is modulated to a high data rate of tens of several Gb/s and can be used for optical demultiplexing of optical time-division multiplexed signals by means of a short optical control pulse having a pulse width as small as 1 ps.

Inter-subband transition is normally allowed for the TM mode and forbidden for the TE mode. However, it is known that, if the transition energy is large, absorption is also observable in the TE mode because of possible deviation of the dispersion curve of the conduction band from a parabolic curve, reduced symmetry due to strain and other reasons.

Thus, various combinations may be possible for polarized waves of exciting light, signal light and conjugate light so that desirable values may be selected for the absorption coefficient and the nonlinear susceptibility. A polarization coupler may conveniently be used for light multiplexing by combining orthogonally polarized light waves.

Since energy dispersion curves against the wave number in the well plane for each subband of the conduction band are substantially parallel to each other, the half width of an inter-subband absorption spectrum is normally small.

However, with the quantum well of the fifth embodiment, the half width is made rather wide as a result of the formation of minibands and the dispersion curve is deviated from the parabolic curve so that resonant absorption can be realized over a wide range of wavelength in practical applications.

Note that, while the net gain may be reduced for the semiconductor laser amplifier as a result of inter-subband absorption, the influence of such reduction in the gain can be compensated by connecting an external optical amplifier.

As described above, the wavelength conversion device of the fifth embodiment can realize a high conversion efficiency. Thus, the level difference between exciting light and conjugate light and the level difference between signal light and conjugate light that are very large in a conventional wavelength conversion device can be reduced significantly, and the level difference between noise of the semiconductor laser amplifier and conjugate light can be increased. Therefore, the extinction ratio may not necessarily be rigorously defined for a narrow band optical filter if the fifth embodiment is used. Additionally, it can greatly improve the S/N ratio.

(6th Embodiment)

FIG. 27 is a partially cut-away schematic perspective view of a wavelength conversion device according to the sixth embodiment of the present invention.

In this embodiment, four wave mixing of a traveling wave type semiconductor laser amplifier is utilized for wavelength conversion.

The sixth embodiment of semiconductor optical waveguide device is a traveling wave type semiconductor wavelength amplifier comprising an InGaAsP active layer and a GaN/AlN quantum well layer (second optical waveguide layer) that operates as part of an optical waveguide. The intersubband absorption wavelength of the GaN/AlN quantum well layer can be controlled by applying an electric field.

Referring to FIG. 27 comprises a stripe-shaped optical waveguide 402 formed on a p-type InP substrate 401. The semiconductor optical waveguide 402 is realized by sequentially arranging an InP substrate 401 that also operates as a lower clad layer, a p⁻-type InGaAsP optical waveguide layer 403, an undoped InGaAs/InGaAsP quantum well active layer 404, an n-type InGaAsP optical waveguide layer 405, an undoped InGaN layer 411, a quantum well layer 412 operating as an inter-subband transition resonant absorption layer and made of undoped GaN/n-type AlN and an n-type AlGaN layer 413 that operates as an upper clad layer in the above order to form a multilayer structure.

The optical waveguide 402 is externally surrounded by an n-type InP layer 408 and a p-type InP layer 409 that operate as electric current confining layers as well as by an n-type InGaAsP layer 407 arranged so as to contact the lateral sides of the active layer 404. The GaN/AlN quantum well layer 412 includes a region having a relatively large well width and another region having a relatively small well width, which regions are arranged along the waveguide. A pair of grooves 414, 414 are formed along the respective lateral sides of the optical waveguide 402 to produce a ridge-shaped optical waveguide.

Electrodes 415, 416, 417 are formed respectively on the n-type InGaAsP layer 407, on the n-type AlGaN layer 413 and under the p-type InP layer 401. The input and output facets are coated with an anti-reflection film 418 and the optical waveguide 402 is separated with the facets by the window structure, so that the reflectivity of the facets are suppressed to be less than 0.1%.

The above structure can be typically prepared in a manner as described below. Firstly, an optical waveguide layer 403, an active layer 404 and an optical waveguide 405 are sequentially formed by epitaxial growth on a substrate to produce a semiconductor epitaxial growth substrate 401. Apart from this, a nitride epitaxial multilayer film is formed on a substrate which is typically made of sapphire by arranging an InGaN layer 411, an inter-subband absorption layer 412 and an AlGaN layer 413 via an ZnO layer or a buffer layer disposed therebetween. A well width modulation structure can be produced by repeating a selective growth process twice for the respective regions, although such a well width modulation structure may alternatively be prepared through a single growth process by using a technique such as mask selective growth (capable of changing the growth rate by mask width) which is well known for the growth of InGaAsP.

Thereafter, the substrate and the nitride epitaxial multilayer film are separated from each other by selectively etching the ZnO layer. The obtained epitaxial multilayer film is then bonded to an InP substrate 401 under pressure in such a way that the InGaAsP optical waveguide layer 405 and the undoped InGaN layer 411 are arranged vis-a-vis, and the assembled components are subjected to a heat treatment in a hydrogen atmosphere to produce a unified entity. The bonding operation normally shows an excellent result because both of the oppositely arranged layers contain indium (In).

The directly bonded multilayer structure prepared in this way is then dry-etched to produce a designed profile of optical waveguide 402 and, thereafter, buried layers 408, 409, 407 are formed by epitaxial growth, using the nitride epitaxial multilayer film as a selective growth mask. Subsequently, a pair of grooves 414, 414 are formed on the respective lateral sides of the waveguide. Then, upper electrodes 415, 416 are prepared and the underside of the InP substrate 401 is polished to form a lower electrode 417 thereon. Thereafter, a device as illustrated in FIG. 27 is produced as a result of a series of processing operations including cleavage and dicing for cutting out chips and formation of anti-reflection films 418.

A semiconductor chip prepared in this manner is then put on a Cu mount having an Au coated AlN submount that operates as a heat sink and an electric terminal with the lower electrode 417 disposed therebetween, whereas the upper electrodes are connected to feed lines by bonding and by way of strip lines. Then, it is put together with input/output optical fibers, a pair of aspherical lenses for realizing a low loss optical coupling with the input/output optical fibers, an optical isolator and a Peltier cooler to produce a module.

With a wavelength conversion device as illustrated in FIG. 27, electrons are injected from the upper electrode 415 into the active layer 404 by way of the InP buried layer 407 and the InGaAsP layer 405, whereas holes are injected from the substrate 401 into the active layer 404 through the InGaAsP layer 403. Since a stimulated emission gain is produced in the active layer 404 as a result of population inversion of electrons and holes, light having a wavelength of or close to 1.55 μm and introduced into the optical waveguide 402 is amplified. As no multiple reflection takes place along the direction of optical waveguide, no laser oscillation occurs during the operation of current injection and amplification is realized with a large gain.

Since the bandgaps of InGaN, GaN and AlN are by far greater than those of InP and InGaAsP and there is a high potential barrier for the carriers in the active layer 404 and the optical waveguide layer 405, no carrier injection takes place there. Additionally, since the bandgap of GaN is large (3.4 to 3.6 eV), none of two-, three- and four-photon absorption takes place as a result of inter-band transition if light with a wavelength of 1.55 μm band is introduced so that the carrier density in the GaN well layer does not significantly fluctuate.

A deep quantum well is formed in the conduction band of the GaN/AlN quantum well layer 412.

The bottom of the conduction band of AlN and that of the conduction band of GaN are found at point $\Gamma_1$. While AlN that constitutes a barrier layer for the quantum well layer 412 is doped to n-type, most electrons are distributed in the first subband related to $\Gamma_1$ of GaN when there is no light. An undoped AlN layer may be arranged between the n-type AlN barrier layer and the undoped GaN well layer in order to prevent the impurities of AlN from adversely affecting the potential of the hetero interface. If the most externally located AlN barrier layers are undoped and have a sufficient thickness, they can prevent a real electric current from flowing therethrough when a voltage is applied thereto.

In regions of the GaN/AlN quantum well layer where the well has a relatively large width, it is so regulated as to make the energy difference between the first and second subbands of $\Gamma_1$ equal to 0.79 eV. On the other hand, in regions where the well has a relatively small width, it is so regulated as to make the energy difference between the first and second subbands equal to 0.81 eV. The transition between the first and second subbands is allowed for the TM mode.

Since energy dispersion curves against wave number in the well plane of the two subbands are separated by a constant energy regardless of the wave number at and near $\Gamma_1$ where electrons exist, the width of the absorption spectrum can be reduced to as small as 20 meV if possible causes of uneven energy spread such as fluctuations in the well width and those in the potential due to impurities can be effectively eliminated.

While light shows an energy distribution peak in or near the active layer 404, it is in fact guided in a mode that allows it to partly permeate into the GaN/AlN quantum well layer 412. Therefore, if light having a wavelength corresponding to the above described inter-subband transition (1.53–1.57 μm) is transmitted through the waveguide 402 in the TM mode, part of the light is absorbed by electrons in the first subband to excite them to the energy level of the second subband.

Four wave mixing takes place under this condition as the absorption coefficient and the refractive index fluctuate depending on the intensity of the guided light.

Thus, the wavelength conversion device of the sixth embodiment operates basically same as the fifth embodiment except that intra-band resonant absorption takes place in an inter-subband absorption layer formed independently from the active layer. Therefore, it can efficiently operate for wavelength conversion over a large bandwidth.

(7th Embodiment)

A wavelength conversion device according to the seventh embodiment has a configuration substantially same as that of the traveling wave type semiconductor laser amplifier according to the first embodiment (FIG. 8) described earlier. So, those component of the seventh embodiment that are same or similar to their counterpart of the first embodiment will not be described here any further. While the first embodiment of semiconductor optical waveguide device is designed as a traveling wave type semiconductor laser amplifier, the seventh embodiment is used as a wavelength conversion device. The phenomenon of four wave mixing of a traveling wave type semiconductor laser amplifier is used for wavelength conversion in the seventh embodiment.

Referring to FIG. 8, an electric current is injected into the $Hg_{0.3}Cd_{0.7}Te$ active layer 24 by way of the n-side and p-side electrodes 26 and 27 of the seventh embodiment. The $Hg_{0.3}Cd_{0.7}Te$ active layer 24 shows a stimulated emission gain at or near the wavelength of 1.3 μm. Note that the $Hg_{0.3}Cd_{0.7}Te$ active layer 24 of this embodiment is a semiconductor layer designed to have an inter-valence band absorption wavelength found within the gain band of the traveling wave type semiconductor laser amplifier.

Therefore, both amplification due to the stimulated emission gain and inter-valence band absorption take place, and both the refractive index and the gain change remarkably as the energy distribution of holes changes to consequently give rise to a high degree of nonlinearity and a high conversion efficiency. Additionally, the time required for relaxation of inter-valence band absorption is as short as hundreds femtoseconds at most. Thus, the conversion efficiency does not drop remarkably if the wavelength difference is increased.

As will be understood from the above description, the seventh embodiment can be used for high efficiency wavelength conversion over a large bandwidth as in the case of the fifth and sixth embodiments that utilize inter-subband transition in the conduction band.

Note that the present invention is by no means limited to the above described embodiments. For instance, the materials and the compositions of the active layer and the intra-band resonant absorption layer and their thicknesses as well as the structure of the semiconductor optical waveguide are not limited to those described above by referring to the embodiments. In other words, the gain wavelength, the absorption coefficient, the extent of nonlinearity and the polarization can be modified by structurally modifying the device. The semiconductor layer, in which the resonant wavelength of intra-band absorption is found within the gain band of the traveling wave type semiconductor laser amplifier, operates as an active layer or it is independent from the active layer and the clad layer in the above description. However, the semiconductor layer may alternatively operates as part of the clad layer. What is essential for the semiconductor layer is that it is located within the power distribution zone of light guided through the semiconductor optical waveguide.

Additionally, the wavelength conversion device is not necessarily required to be an independent device. It may be combined with one or more than one semiconductor lasers, optical modulators, optical switches, optical multiplexer/demultiplexers, wavelength selection devices, light receiving devices and other wavelength conversion devices to form a larger integrated entity.

In short, as described above by referring to the fifth through seventh embodiments, a large bandwidth high efficiency wavelength conversion device can be realized by using a semiconductor optical waveguide having a semiconductor layer whose intra-band absorption resonant wavelength is located within the gain band of a corresponding traveling wave type semiconductor laser amplifier.

(8th Embodiment)

A semiconductor optical waveguide device according to the eighth embodiment is a tunable wavelength filter having a configuration substantially equal to that of the wavelength conversion device according to the sixth embodiment (FIG. 27). So, those component of the eighth embodiment that are same or similar to their counterpart of the sixth embodiment will not be described here any further. While the sixth embodiment of semiconductor optical waveguide device is designed as a wavelength conversion device, the eighth embodiment is used as a tunable wavelength filter.

FIG. 28A shows a graph of the spectrum of the gain (dotted broken line) of the active layer of FIG. 27 and the that of the loss (broken line) of the GaN/AlN quantum well layer 412 when no voltage is applied thereto and FIG. 28B shows the corresponding net transmission spectrums. The loss of the transmission band caused by the inter-subband absorption is compensated by the gain of the active layer 404.

As a voltage is applied between the electrodes 415 and 416 to apply an electric field to the quantum well, the inter-subband energy difference is enlarged by the quantum confining Stark effect to shift the resonant wavelength to the shorter side. If the GaN/AlN quantum well 412 has an asymmetric structure such as AlN/GaN/AlGaN/AlN, large changes in the inter-subband resonant absorption wavelength can be produced by applying an electric field although the absorption spectrum comes to show a large width. The broken line in FIG. 28B indicates the net gain/loss spectrum obtained by applying a voltage. The rate of the transmission wavelength change caused by an electric field is limited mainly by LCR of the voltage applying system so that a response time of several hundred picoseconds can be obtained.

Note that, while the two regions (a region having a relatively large well width and a region having a relatively small well width) of the second semiconductor optical waveguide layer of the eighth embodiment are simultaneously controlled by a common electrode 416, strictly speaking, they are different from each other in terms of the extent of shift of the absorption peak wavelength relative to the applied voltage. Additionally, the width of the absorption spectrum and the absorption coefficient also change as a function of the voltage. In order to effectively control the transmission peak wavelength regardless of these changes, keeping the transmission characteristics substantially constant, it is preferable to divide the electrode 416 into two sections so that the above two regions may be controlled independently. With an electrode having two divided section, it is also possible to control certain aspects of transmission other than the transmission wavelength such as the transmission bandwidth.

A filter having a plurality of transmission wavelengths or a tunable wavelength filter having a complex distribution pattern of transmission and absorption bands can be realized by dividing the second semiconductor waveguide layer 412 into a number of regions greater than two.

The tunable wavelength filter of the eighth embodiment is protected against multiple reflections of light by the anti-reflection film 418 formed on the facets and the window structure so that the width of the short optical pulse may not be expanded. Electrons excited to the energy level of the second subband quickly relax to the original low energy level in a very short period of time of several picoseconds as they repeatedly collide with electrons and phonons. Therefore, the foregoing pulse would not affect the following pulse even if the energy of short optical pulses is absorbed for every several picoseconds.

As described below, the tunable wavelength filter of the eighth embodiment differs from a device in which a light absorbing section for inter-subband absorption that can quickly tune the wavelength and an optical amplifier section that is free from inter-subband absorption are connected with a cascade connection arrangement.

With an arrangement where an optical amplifier is connected behind a light absorbing section, ASE noises generated by the optical amplifier is added to the absorption wavelength to worsen the signal to noise ratio. The signal with an aggravated S/N ratio cannot restore its original signal quality by amplification. Contrary to this, the signal to noise ratio of a semiconductor optical waveguide device according to the invention can be maintained to a high level because ASE noises in the absorption wavelength band are also absorbed. A semiconductor optical waveguide device according to the present invention has an amplifying ability and, if used as an initial amplifier having an excellent signal to noise ratio and connected to a downstream optical amplifier, higher output power can be obtained.

To the contrary, in an arrangement where a light absorbing section utilizing inter-subband absorption is disposed downstream and connected to an optical amplifier, light is firstly amplified by the optical amplifier and then introduced into the light absorbing section. This arrangement cannot provide outputs stably since it is affected by saturation of inter-subband absorption, incidental heat generation and enhanced nonlinearity. It will be seen from the above that a semiconductor optical waveguide device according to the present invention can provide a wide dynamic range for the input and output energy levels.

Figure 29:
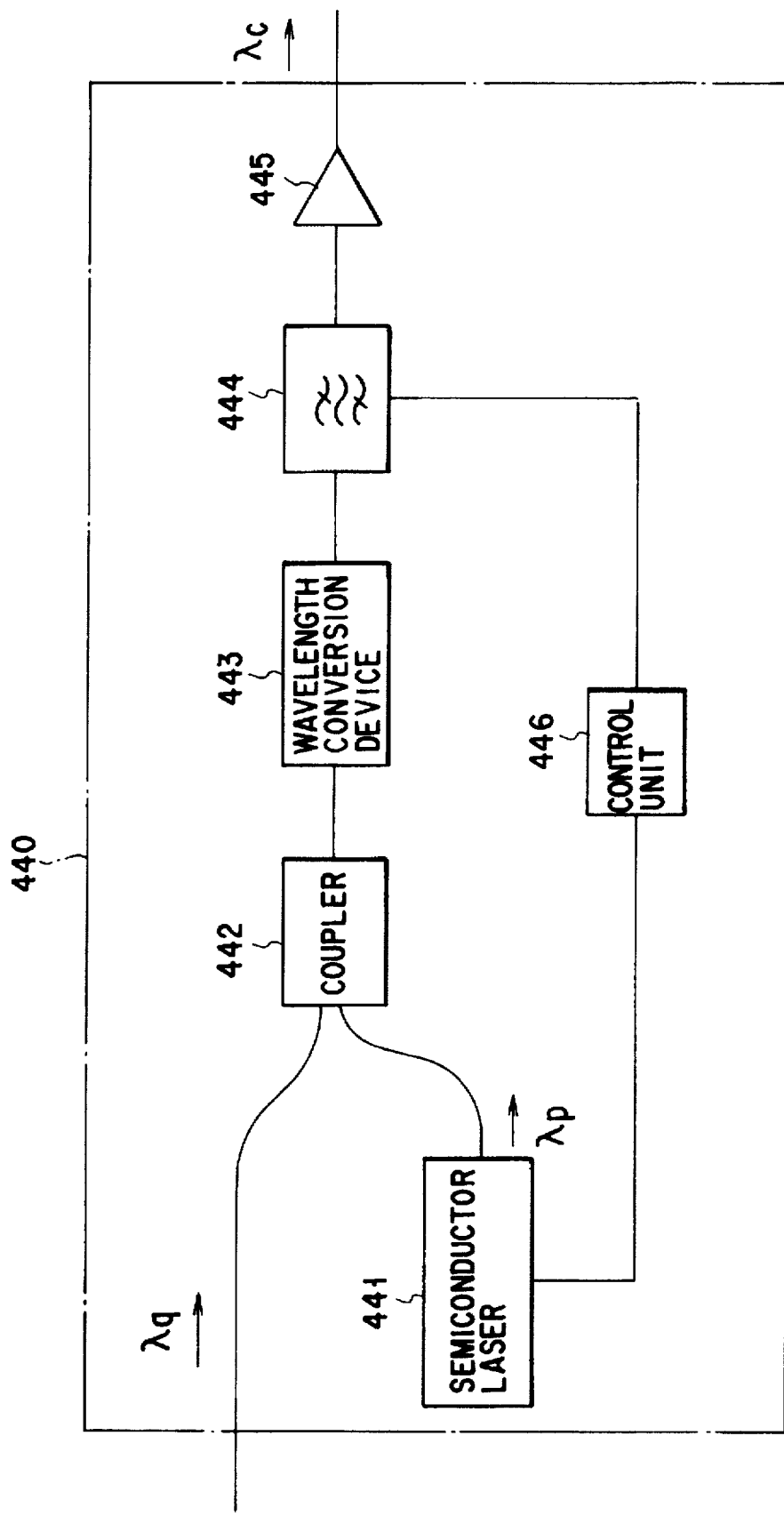
FIG. 29 is a schematic illustration of a wavelength conversion node using a tunable wavelength filter as illustrated in FIG. 27.

FIG. 29 is a schematic illustration of a wavelength conversion node realized by using a tunable wavelength filters of FIG. 27. The major components of the wavelength conversion node include a rapidly wavelength tunable semiconductor laser 441, a coupler for multiplexing signal light and the optical output of the tunable semiconductor laser 441, a wavelength conversion device 443 consisting in a traveling wave type semiconductor laser amplifier, a semiconductor optical waveguide device (tunable wavelength filter) 444 according to the present invention, an optical fiber amplifier 445 and a control unit 446.

For the wavelength conversion node 440 of FIG. 29, signal light is constituted by a packet of short pulse train having a wavelength of $\lambda_q$. The rapidly wavelength tunable semiconductor laser 442 produces a pump light pulse having a wavelength of $\lambda_p$ defined for each packet in synchronism with the signal light pulse. The signal light having the wavelength of $\lambda_q$ and the pump light having the wavelength of $\lambda_p$ are subjected to four wave mixing in the wavelength conversion device 443, which generates conjugate signal light having a wavelength of $\lambda_c = 2\lambda_p - \lambda_q$.

The control unit 446 operates to control the oscillation wavelength of the rapidly wavelength tunable semiconductor laser 441 to make it agree with the wavelength $\lambda_p$ determined by the wavelength $\lambda_q$ of the original signal packet and the wavelength $\lambda_c$ of the packet to be obtained by conversion. It also controls the transmission wavelength $\lambda_c$ of the rapidly wavelength tunable filter 444. Thus, the operation of wavelength conversion can be carried out for each packet.

Routing of the signal light can be realized by connecting a planer lightwave circuit (e.g., planer lightwave circuit (PLC)) that defines the output as a function of wavelength to this node. This node may also be applicable to an add-drop multiplexer. A space and wavelength division multiplexed optical switch can be realized by arranging a plurality of such nodes in parallel and connecting them via routing PLC to produce a multi-stage arrangement.

Since conventional wavelength conversion nodes are slow in response, they cannot be used for a high speed packet switch while they are feasible for the operation of slow wavelength switching type cross connect that entails a long switching time. Thus, a semiconductor optical waveguide device according to the present invention will be able to develop a number of new applications including those described above.

While an optical waveguide device according to the present invention is used for the rapidly wavelength tunable filter 444 of FIG. 29, it may also be used for the wavelength conversion device 443, which is a traveling wave type semiconductor laser amplifier.

More specifically, if the inter-subband absorption wavelength is close to any of the wavelengths involved in four wave mixing, the efficiency of four wave mixing caused by carrier heating or spectral hole burning can be improved further. Additionally, the wavelength conversion performance can be optimized for each combination of wavelengths involved in the operation of wavelength conversion by externally controlling the inter-subband absorption spectrum.

For example, there can be a combination of wavelengths with which the efficiency of wavelength conversion can be reduced as a result of phase interference of the three factors of carrier density change, carrier heating and spectral hole burning that participate in the operation of four wave mixing. If such is the case, the conversion efficiency can be improved as a result of interference by changing the ratio (a parameter) of the real part and the imaginary part of the nonlinear susceptibility $\chi^{(3)}$ by applying a voltage to the second semiconductor optical waveguide layer so that the operation of wavelength conversion can be carried out highly efficiently regardless of the combination of wavelengths.

In short, a semiconductor optical waveguide device according to the present invention is a multifunctional device that can be used as a wavelength conversion device or a tunable wavelength filter. In other words, an integrated entity comprising a number of wavelength conversion devices and tunable wavelength filters may be produced by a single manufacturing process. This sort of integration provides a number of advantages including the following. (1) The coupling loss involved in connecting the devices with optical fibers can be reduced. (2) An enhanced stability relative to changes in the environment can be achieved. (3) No additional effort for modularization is required. (4) A small and lightweight unit can be manufactured with ease. (5) A significant cost reduction can be realized. Additionally, most part of the wavelength conversion node of FIG. 29 can be produced in the form of a single chip because a semiconductor optical waveguide device according to the present invention can be used for a tunable wavelength laser as will be described hereinafter by referring to the ninth embodiment of the present invention.

(9th Embodiment)

Figure 30:
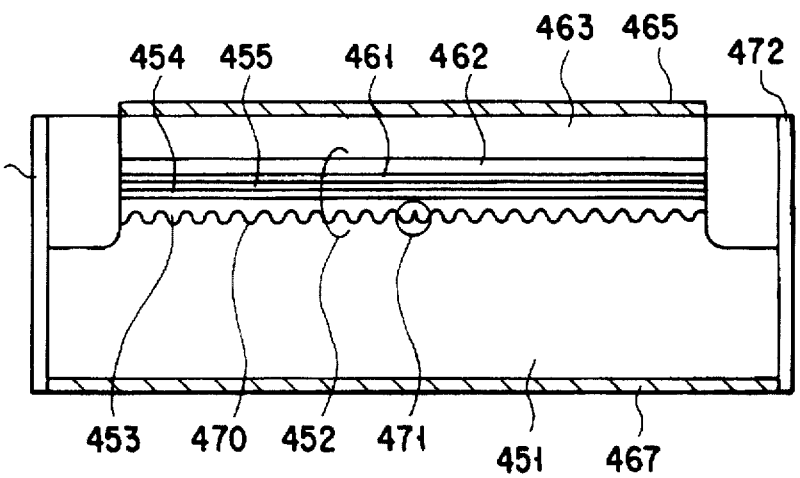
FIG. 30 is a schematic cross sectional view of a tunable wavelength DFB laser according to a ninth embodiment of the present invention, showing its optical waveguide.

A semiconductor optical waveguide according to the ninth embodiment of the present invention is applied to a tunable wavelength DFB laser. FIG. 30 is a schematic cross sectional view of a tunable wavelength DFB laser, shown along the optical waveguide.

Referring to FIG. 30, the tunable wavelength DFB laser comprises a p⁻-type InGaAsP optical waveguide layer 453, an undoped tensile strained InGaAsP/InGaAsP quantum well active layer 454, an n-type InGaAsP optical waveguide layer 455, an undoped InGaN layer 461, an undoped GaN/n-type AlN quantum well layer 462 for operating as an inter-subband absorption layer and an n-type AlGaN layer 463 for operating as an upper clad layer are arranged sequentially on a p-type InP substrate 451 to form a multilayer structure. The basic configuration of the above structure is same as that of the tunable wavelength filter of the above described eighth embodiment. The embodiment shows a cross sectional view similar to that of the tunable wavelength filter of the eighth embodiment along a plane perpendicular to the optical waveguide 452 having the above multilayer structure.

Electrodes 465 and 467 are formed respectively on the n-type AlGaN layer 463 and under the substrate 451, while the n-type InGaAsP optical waveguide 455 is electrically connected to a third electrode (not shown) as in the case of the tunable wavelength filter of the eighth embodiment. The procedures for injecting an electric current and for applying a voltage are also similar to those of the tunable wavelength filter of the eighth embodiment. An optical isolator is incorporated into the module to prevent any externally reflected light from coming back to the laser.

The tunable wavelength DFB laser of FIG. 30 differs from the tunable wavelength filter of the eighth embodiment in that a diffraction grating is formed on the interface of the InP substrate 451 and the InGaAsP optical waveguide layer 453, that the active layer has a strained quantum well structure and that the active layer does not have a plurality of regions along the optical waveguide. A ¼ wavelength phase shifter 471 is formed at the center of the diffraction grating 470 whereas an anti-reflection film 472 is formed on each of the facets. The number of wells in the GaN/AlN layer 462 is slightly larger than that of the eighth embodiment so that the optical mode distribution extensively overlies the well layer.

Since optical feedback is realized by the diffraction grating, a single mode oscillation can occur when an electric current is injected into the active layer 454 at sufficiently high rate. Thanks to the phase shifter 471 and the anti-reflection films 472, the oscillation proceeds stably at and near the center of the stop band around the Bragg wavelength. Since the active layer 454 comprises tensile strained quantum wells, the oscillation takes place in the TM mode.

Figure 31:
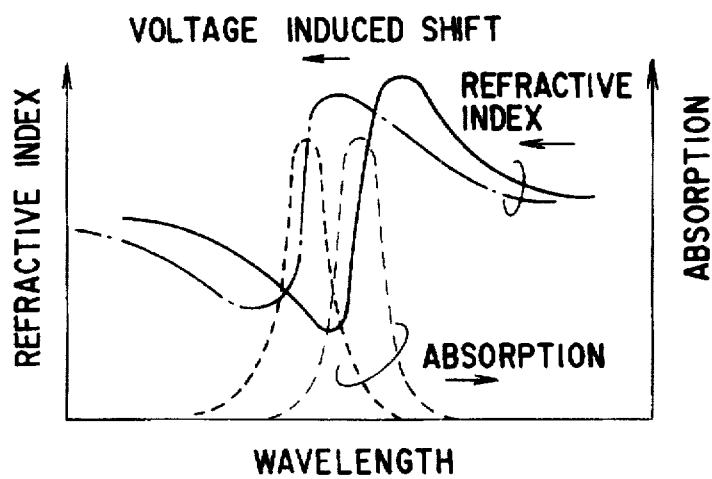
FIG. 31 is a graph showing absorption spectrums (dotted lines) and the change in the refractive index (solid line) of the tunable wavelength DFB laser of FIG. 30 obtained by applying a variable voltage.

As shown in the graph of FIG. 31, the refractive index for the TM mode is high at the long wavelength side of the wavelength band that give rise to inter-subband absorption and low at the short wavelength side. While the absorption spectrum has a narrow width, the refractive index fluctuates over a wide range of wavelength as a result of inter-subband absorption. The rate at which the refractive index change is reduced as the extent of detuning with the inter-subband absorption wavelength increases.

Thus, by appropriately selecting the extent of detuning between the inter-subband absorption wavelength without electric field and the laser oscillation wavelength, the refractive index can be reduced by electric field without remarkably modifying the absorption coefficient. Additionally, since optical mode distribution extensively overlies the GaN well layer, the reduction in equivalent refractive index of the optical waveguide is large and the oscillation wavelength is greatly shifted to the short wavelength side.

Since the response speed for a change in the wavelength is subjected to LCR restrictions, a wavelength tuning operation can be carried out with ease in a sub-nanosecond range if sufficient care is taken for the drive circuit and the mounting method. Note here that it is very difficult to change only the refractive index with inter-band transition because the absorption spectrum is normally wide. To the contrary, fluctuations in the output power can be minimized according to the present invention because the refractive index can be varied without greatly modifying the absorption coefficient.

While the present invention is described above in terms of application to a tunable wavelength laser, it can also be applied to a Fabry-Perot type semiconductor laser having reflection planes at the opposite facets to realize mode locking by utilizing the second semiconductor optical waveguide layer as a saturable absorber.

Figure 32A:
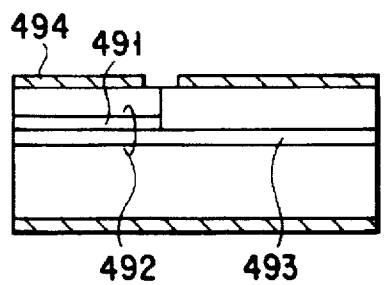
FIGS. 32A and 32B are schematic cross sectional views of devices obtained by modifying the semiconductor optical waveguide device of FIG. 30.
Figure 32B:
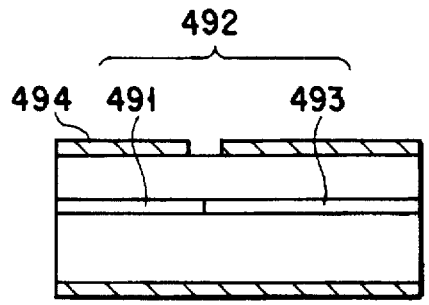

Also, as shown in FIG. 32A, the second semiconductor optical waveguide layer 491 may be formed only in part of the waveguide 492. Alternatively, as shown in FIG. 32B, the region containing the active layer 493 and the region containing the second semiconductor optical waveguide layer 491 may be connected in series. Additionally, a sine wave voltage may be applied to the voltage terminal 494 to control absorption in order to realize active mode locking. By so arranging that the resonant wavelength can be modified on the both sides of the wavelength of the center of oscillation by applying a sine wave voltage, the active mode locking can be realized with a period twice as large as that of the modulation voltage. The performance of the laser can be controlled by means of a cw-voltage in the case of passive mode locking.

If the second semiconductor optical waveguide layer is integrally formed outside the resonator of the DFB laser, the device can be used for an optical modulator integration type light source. Then, as shown in FIG. 31, the ratio (α parameter) of the change in the refractive index and the change in the absorption coefficient can be modified to a great extent by selecting appropriate values for the wavelength and the bias.

The present invention is not limited to the above embodiments and various modifications can be made to them. More specifically, while GaN/AlN quantum wells are used for the second semiconductor optical waveguide layer in the above description, inter-subband absorption can be realized for a wavelength of 1.55 μm in an InGaAs/strained AlAs conduction band or a II-VI group semiconductor valence band. When InGaAs/strained AlAs is concerned, both the first and second semiconductor optical waveguide layers may be produced in a single epitaxial growth process. Note that the wavelength is not necessarily limited to 1.55 μm.

Inter-subband absorption of valence band or intervalence band absorption can be utilized for intra-band resonant absorption. In order to avoid two-photon absorption from taking place, it is preferable to use a wide band gap semiconductor such as GaN, although, conversely, it may be possible to realize new nonlinear optical devices by combining the effect of two-photon absorption in the second semiconductor optical waveguide and that of inter-band resonant absorption. A variety of combinations of polarized input and output lights may be possible for nonlinear optical devices by utilizing the difference in the magnitude of inter-subband absorption between the TM mode and the TE mode. It may be needless to say that the first semiconductor optical waveguide layer too is not limited to InGaAsP type substances. Additionally, a material other than semiconductor may be inserted between the first and second semiconductor optical waveguide layers. Materials and wavelengths other than those specifically described above may be used in many different combinations.

The buried type, the ridge-mesa type and various other types may be used for the optical waveguide. The arrangement for confining the electric current to the active layer and the means for applying an electric field to the second semiconductor optical waveguide layer are not limited to those specifically described above by referring to the embodiments.

The present invention is applicable to a variety of devices other than those described above by referring to the embodiments and they include polarized wave control devices (capable of controlling absorption in the TM mode), wavelength selection type optical modulators, and optical modulators and amplifiers capable of controlling the a parameter. A device according to the present invention and having functional features same as those of its conventional counterpart may have its functions improved remarkably. For instance, an optical control type optical switch according to the present invention can operate highly efficiently and may be provided with regulation capabilities. Since a semiconductor optical waveguide device according to the present invention is a multi-functional device as described earlier by referring to the eighth embodiment, a highly integrated single chip device having a variety of functional features may be realized by using such a semiconductor optical waveguide device.

As described in detail for the eighth and ninth embodiments above, a semiconductor optical waveguide device according to the present invention can be used for a variety of new applications including a rapidly wavelength tunable filter, a high efficiency wavelength conversion device and a rapidly wavelength tunable laser as well as an integrated device realized by combining the functional features of such devices. Thus, the present invention can be used for realize highly efficient multi-functional light sources, light receiving devices and optical waveguide devices.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor optical waveguide device comprising:

a stripe-shaped semiconductor optical waveguide, part of said semiconductor optical waveguide being an active layer producing gain by electric current injection, and part of said semiconductor optical waveguide being an intra-band resonant absorption layer in which an intra-band absorption resonant wavelength is arranged within the gain band of said active layer; and means for injecting electric current into said active layer.

2. A semiconductor optical waveguide device according to claim 1, wherein said intra-band resonant absorption layer and said active layer closely laminated and constitute an integral optical waveguide.

3. A semiconductor optical waveguide device according to claim 2, wherein said intra-band resonant absorption layer is made of a material in which a bandgap is greater than double of that of said active layer.

4. A semiconductor optical waveguide device according to claim 3, wherein said active layer is composed of one or more III–V group compound semiconductors mainly including arsenic element and/or phosphorus element, and said intra-band resonant absorption layer has a multi-layer structure and is composed of III–V group compound semiconductors mainly including nitrogen element.

5. A semiconductor optical waveguide device according to claim 2, further comprising means for controlling resonant wavelength of said intra-band resonant absorption layer.

6. A semiconductor optical waveguide device according to claim 5, wherein said means for controlling resonant wavelength of said intra-band resonant absorption layer is divided into a plurality of sections.

7. A semiconductor optical waveguide device according to claim 5, wherein impurities are doped into at least one part of said intra-band resonant absorption layer.

8. A semiconductor optical waveguide device according to claim 1, wherein the intra-band absorption resonant wavelength of said intra-band resonant absorption layer is an inter-valence band absorption resonant wavelength.

9. A semiconductor optical waveguide device according to claim 1, wherein said intra-band resonant absorption layer has a quantum well structure, and its intra-band absorption resonant wavelength is an inter-subband transition resonant wavelength of the quantum well.

10. A semiconductor optical waveguide device according to claim 1, wherein said intra-band resonant absorption layer is identical to said active layer.

11. A semiconductor optical waveguide device according to claim 1, wherein control light and signal light are introduced into said semiconductor optical waveguide and the control light modifies intensity and/or phase of the signal light, and density of electrons and holes injected into said active layer are regulated so as to establish an equilibrium between loss and gain of said semiconductor optical waveguide at and near the wavelength of the control light and the signal light.

12. A semiconductor optical waveguide device according to claim 1, wherein lights having a plurality of wavelength is introduced into said semiconductor optical waveguide, and another light having wavelength different from any one of that of lights is generated by four wave mixing in said semiconductor optical waveguide.

13. An optical control type optical switch in which at least one of destination, intensity, wavelength, and phase of a signal light output is controlled by a control light, comprising:

a stripe-shaped semiconductor optical waveguide, part of said semiconductor optical waveguide being an active layer;

means for inputting and outputting the signal light and the control light; and means for regulating the density of electrons and holes of the active layer so as to establish an equilibrium between loss and gain of said semiconductor optical waveguide at and near the wavelength of the signal light and the control light, wherein part of said semiconductor optical waveguide is made of a material having an intra-band resonant absorption at the wavelength of the control light.

14. An optical control type optical switch in which at least one of destination, intensity, wavelength, and phase of a signal light output is controlled by a control light, comprising:

a stripe-shaped semiconductor optical waveguide constituting a part of optical interferometer, wherein:

part of said semiconductor optical waveguide is an active layer, said semiconductor optical waveguide has means for regulating the density of electrons and holes of the active layer so as to establish an equilibrium between loss and gain of said semiconductor optical waveguide at and near the wavelength of the signal light and the control light, and part of said semiconductor optical waveguide is made of a material having an intra-band resonant absorption at the wavelength of the control light.

15. A wavelength conversion device comprising:

a traveling wave type semiconductor laser amplifier having a semiconductor optical waveguide formed by sandwiching an active layer between a pair of clad layers, wherein light having an angular frequency different from the lights introduced into said semiconductor optical waveguide is generated by four wave mixing in said semiconductor optical waveguide, wherein said semiconductor optical waveguide has a semiconductor layer having an intra-band absorption resonant wavelength arranged within the gain band of said traveling wave type semiconductor laser amplifier.

* * * * *